(12) United States Patent
Karim et al.

(10) Patent No.: US 10,202,691 B2
(45) Date of Patent: Feb. 12, 2019

(54) SHOWERHEAD CURTAIN GAS METHOD AND SYSTEM FOR FILM PROFILE MODULATION

(71) Applicant: Lam Research Corporation, Fremont, CA (US)

(72) Inventors: Ishtak Karim, Portland, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/636,128

(22) Filed: Jun. 28, 2017

(65) Prior Publication Data

US 2017/0362713 A1    Dec. 21, 2017

Related U.S. Application Data

(63) Continuation of application No. 15/186,275, filed on Jun. 17, 2016, now Pat. No. 9,738,977.

(51) Int. Cl.
*H01L 21/00* (2006.01)
*C23C 16/52* (2006.01)
(Continued)

(52) U.S. Cl.
CPC .......... *C23C 16/52* (2013.01); *C23C 16/4408* (2013.01); *C23C 16/458* (2013.01);
(Continued)

(58) Field of Classification Search
CPC ......... H01L 21/67772; H01L 21/67017; H01L 21/67028; H01L 21/67057; H01L 21/67383; H01L 21/67389; H01L 31/0547
(Continued)

(56) References Cited

U.S. PATENT DOCUMENTS

| 4,673,447 A | 6/1987 | Sakai et al. |
| 5,871,811 A | 2/1999 | Wang et al. |

(Continued)

FOREIGN PATENT DOCUMENTS

| CN | 102087955 A | 6/2011 |
| CN | 102136410 A | 7/2011 |

(Continued)

OTHER PUBLICATIONS

U.S. Office Action dated Dec. 15, 2015 issued in U.S. Appl. No. 14/447,203.

(Continued)

*Primary Examiner* — Vu A Vu
(74) *Attorney, Agent, or Firm* — Weaver Austin Villeneuve & Sampson LLP

(57) ABSTRACT

Disclosed are methods of and systems for depositing a film. The methods may include: (a) determining process conditions, including a flow condition of a curtain gas that flows around the periphery of each station in the chamber, for performing film deposition in the chamber, (b) flowing the curtain gas to each station in the chamber during film deposition according to the process conditions determined in (a), (c) determining, during or after (b), an adjusted flow condition of the curtain gas in the chamber to improve substrate nonuniformity, and (d) flowing, after (c), the curtain gas during film deposition according to the adjusted flow condition determined in (c). The systems may include a gas delivery system, a processing chamber, and a controller having control logic for performing one or more of (a)-(d).

32 Claims, 13 Drawing Sheets

(51) Int. Cl.
| | |
|---|---|
| *C23C 16/455* | (2006.01) |
| *C23C 16/458* | (2006.01) |
| *C23C 16/50* | (2006.01) |
| *H01L 21/02* | (2006.01) |
| *C23C 16/44* | (2006.01) |
| *C23C 16/509* | (2006.01) |
| *H01J 37/32* | (2006.01) |
| *H01L 21/66* | (2006.01) |

(52) U.S. Cl.
CPC .. *C23C 16/45519* (2013.01); *C23C 16/45544* (2013.01); *C23C 16/45565* (2013.01); *C23C 16/45574* (2013.01); *C23C 16/50* (2013.01); *C23C 16/509* (2013.01); *H01J 37/3299* (2013.01); *H01J 37/32449* (2013.01); *H01J 37/32513* (2013.01); *H01J 37/32816* (2013.01); *H01J 37/32899* (2013.01); *H01L 21/0217* (2013.01); *H01L 21/02126* (2013.01); *H01L 21/02164* (2013.01); *H01L 21/02167* (2013.01); *H01L 21/02271* (2013.01); *H01L 22/12* (2013.01); *H01L 22/20* (2013.01)

(58) Field of Classification Search
USPC .............................................................. 438/5
See application file for complete search history.

(56) References Cited

U.S. PATENT DOCUMENTS

| | | | |
|---|---|---|---|
| 5,892,235 | A | 4/1999 | Yamazaki et al. |
| 6,002,109 | A | 12/1999 | Johnsgard et al. |
| 6,143,081 | A | 11/2000 | Shinriki et al. |
| 6,192,858 | B1 | 2/2001 | Nieberding |
| 6,217,715 | B1 | 4/2001 | Sun et al. |
| 6,403,925 | B1 | 6/2002 | Johnsgard et al. |
| 8,409,351 | B2 | 4/2013 | Robbins et al. |
| 8,637,411 | B2 | 1/2014 | Swaminathan et al. |
| 8,728,956 | B2 | 5/2014 | LaVoie et al. |
| 8,871,654 | B2 | 10/2014 | Kato et al. |
| 8,956,983 | B2 | 2/2015 | Swaminathan et al. |
| 8,999,859 | B2 | 4/2015 | Swaminathan et al. |
| 9,508,547 | B1 | 11/2016 | Pasquale et al. |
| 9,617,638 | B2 | 4/2017 | LaVoie et al. |
| 9,738,977 | B1 | 8/2017 | Karim et al. |
| 2002/0104556 | A1 | 8/2002 | Puri et al. |
| 2003/0192476 | A1 | 10/2003 | Fork et al. |
| 2008/0173401 | A1 | 7/2008 | Jeon |
| 2008/0280068 | A1 | 11/2008 | Ahn |
| 2009/0038541 | A1 | 2/2009 | Robbins et al. |
| 2009/0109595 | A1 | 4/2009 | Herchen et al. |
| 2009/0233434 | A1 | 9/2009 | Kim et al. |
| 2009/0270849 | A1 | 10/2009 | Truckai et al. |
| 2010/0078578 | A1 | 4/2010 | Schuermann et al. |
| 2012/0009802 | A1 | 1/2012 | LaVoie et al. |
| 2012/0043198 | A1 | 2/2012 | Yamazaki |
| 2012/0269968 | A1* | 10/2012 | Rayner, Jr. ............ C23C 16/452 427/255.26 |
| 2012/0318025 | A1* | 12/2012 | Milicevic .......... C03B 37/01248 65/426 |
| 2013/0171834 | A1 | 7/2013 | Haverkamp et al. |
| 2013/0344245 | A1 | 12/2013 | Xia et al. |
| 2014/0011369 | A1 | 1/2014 | Kato et al. |
| 2014/0044889 | A1 | 2/2014 | Qi et al. |
| 2014/0072726 | A1 | 3/2014 | Kim |
| 2014/0209562 | A1 | 7/2014 | LaVoie et al. |
| 2014/0217193 | A1 | 8/2014 | Breiling et al. |
| 2015/0017812 | A1 | 1/2015 | Chandrasekharan et al. |
| 2015/0030766 | A1* | 1/2015 | Lind ................... C23C 16/4405 427/209 |
| 2015/0048739 | A1 | 2/2015 | Forster et al. |
| 2015/0147889 | A1 | 5/2015 | Yudovsky et al. |
| 2015/0155157 | A1 | 6/2015 | Song et al. |
| 2015/0194298 | A1 | 7/2015 | Lei et al. |
| 2015/0200110 | A1 | 7/2015 | Li et al. |
| 2015/0243490 | A1 | 8/2015 | Ryu et al. |
| 2015/0262792 | A1 | 9/2015 | Bera |
| 2015/0275364 | A1 | 10/2015 | Thompson et al. |
| 2015/0299855 | A1 | 10/2015 | Yudovsky et al. |
| 2015/0299909 | A1 | 10/2015 | Mizuno et al. |
| 2015/0368798 | A1 | 12/2015 | Kwong |
| 2015/0380221 | A1 | 12/2015 | Liu et al. |
| 2016/0035566 | A1 | 2/2016 | LaVoie et al. |
| 2016/0068953 | A1 | 3/2016 | Li et al. |
| 2016/0097122 | A1 | 4/2016 | Yudovsky et al. |
| 2016/0138160 | A1 | 5/2016 | Lambert et al. |
| 2017/0167017 | A1 | 6/2017 | LaVoie et al. |

FOREIGN PATENT DOCUMENTS

| | | |
|---|---|---|
| CN | 103003924 A | 3/2013 |
| CN | 103510072 A | 1/2014 |

OTHER PUBLICATIONS

U.S. Notice of Allowance dated Jul. 29, 2016 issued in U.S. Appl. No. 14/447,203.
U.S. Notice of Allowance dated Nov. 8, 2016 issued in U.S. Appl. No. 14/447,203.
U.S. Notice of Allowance dated Feb. 24, 2017 issued in U.S. Appl. No. 14/447,203.
U.S. Notice of Allowance dated Jul. 20, 2016 issued in U.S. Appl. No. 14/828,291.
U.S. Appl. No. 15/186,275, filed Jun. 17, 2016, Karim et al.
U.S. Office Action dated Nov. 22, 2016 issued in U.S. Appl. No. 15/186,275.
U.S. Notice of Allowance dated Apr. 14, 2017 issued in U.S. Appl. No. 15/186,275.
Chinese First Office Action dated Jul. 3, 2017 issued in CN 201510459965.1.
U.S. Office Action dated Nov. 2, 2018 issued in U.S. Appl. No. 15/445,632.

* cited by examiner

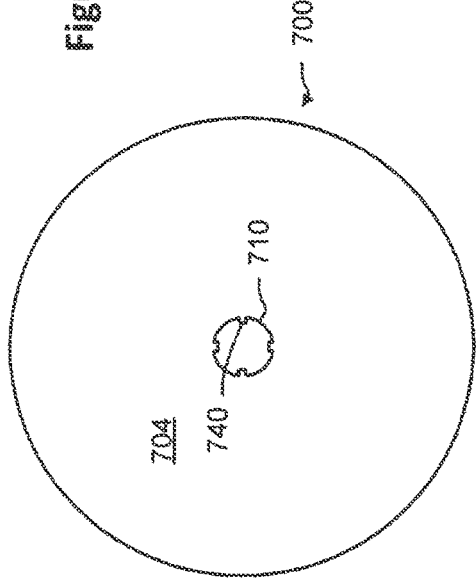
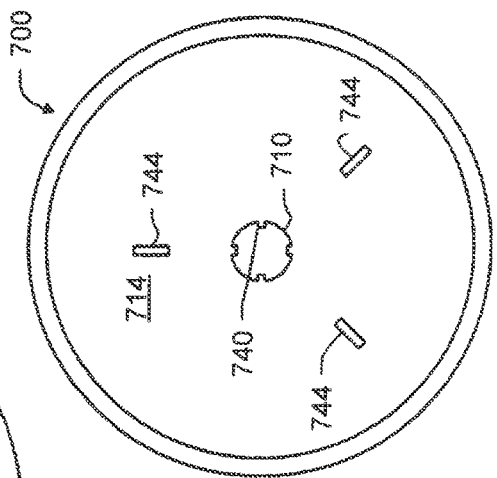
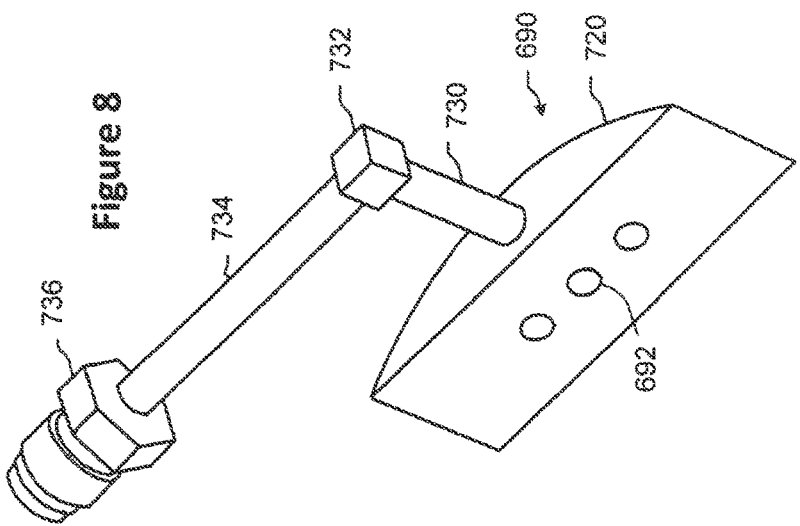

SHOWERHEAD CURTAIN GAS METHOD AND SYSTEM FOR FILM PROFILE MODULATION

CROSS-REFERENCE TO RELATED APPLICATIONS

This application is a continuation of, and claims priority to, U.S. patent application Ser. No. 15/186,275, filed Jun. 17, 2016, and titled "SHOWERHEAD CURTAIN GAS METHOD AND SYSTEM FOR FILM PROFILE MODULATION," which is herein incorporated by reference in its entirety and for all purposes.

BACKGROUND

As integrated circuit (IC) device and substrate feature sizes continue to shrink in the semiconductor industry, as well as the increased use of 3D devices structures in IC designs (e.g., Intel's Tri-Gate transistor architecture), the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material—a result of the ALD process involving the formation of an adsorption-limited layer of one or more film precursor reactants prior to the film-forming surface reaction of the precursors. Multiple "ALD cycles" may then be used to build up a film of the desired thickness, and since each layer is thin and conformal, the resulting film substantially conforms to the shape of the underlying substrate features and/or device structures.

However, there are many challenges associated with employing ALD processes in semiconductor fabrication, oftentimes relating to the fact that many ALD cycles are required to build up a film of appreciable thickness. Rapid ALD cycle times may be facilitated by specialized semiconducting processing hardware, however, without careful design of these deposition apparatuses and the film forming operations performed in them, the uniformity of the resulting ALD films may be compromised. Accordingly, methods, systems, and apparatuses are sought which improve the uniformity of deposited films.

BRIEF DESCRIPTION OF THE DRAWINGS

FIG. 8 depicts a perspective view of an example fluid connector for the showerhead collar of FIG. 7.

FIGS. 9A and 9B are top and bottom plan views of example plates of the showerhead of FIG. 6.

SUMMARY

Figure 1:
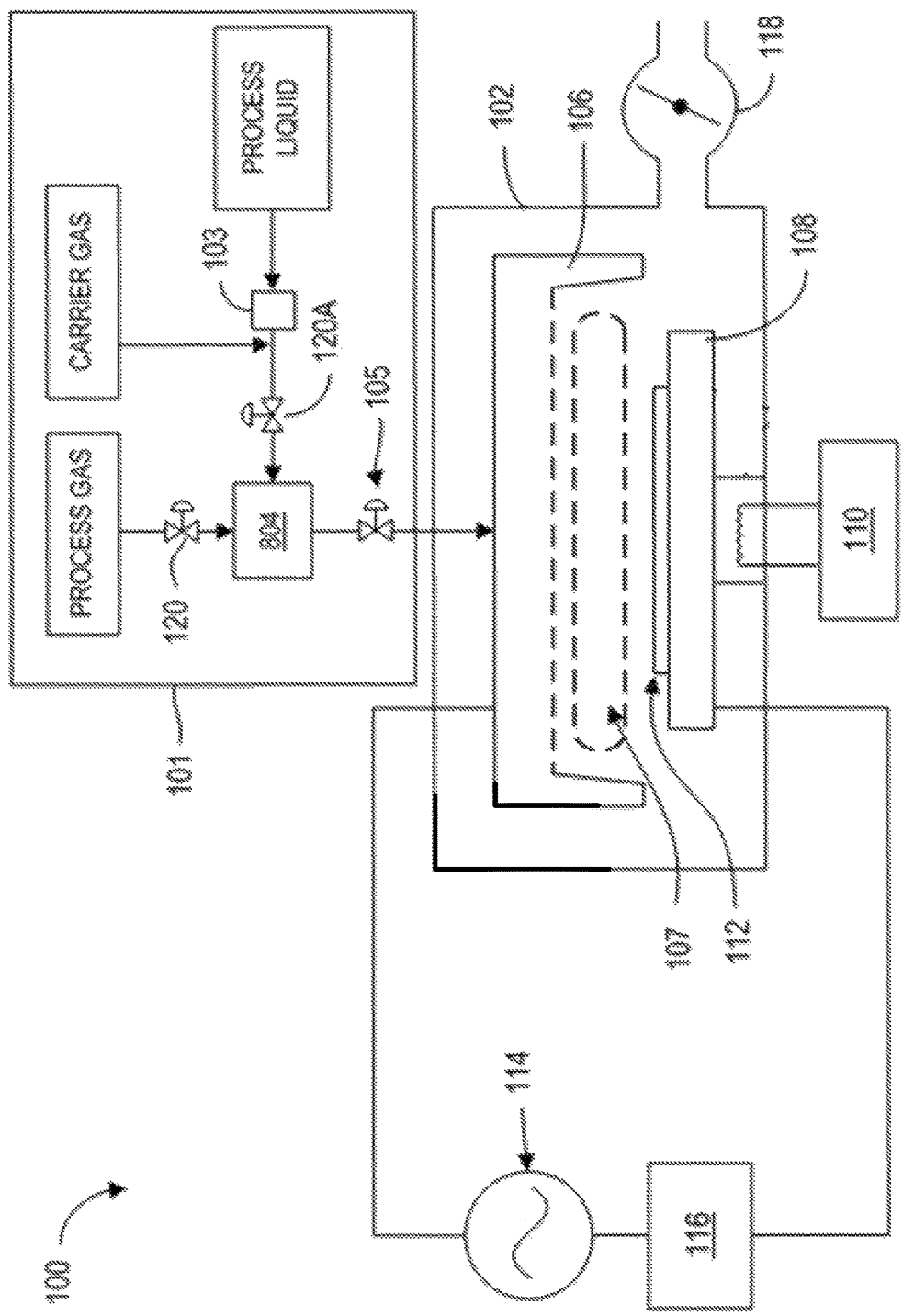
FIG. 1 depicts a cross-sectional schematic of a substrate processing apparatus having a processing chamber with a single process station.

In one embodiment, a method of depositing a film in a multi-station semiconductor processing chamber may be provided. The method may include (a) determining process conditions, including a flow condition of a curtain gas that flows around the periphery of each station in the chamber, for performing film deposition in the chamber; (b) flowing the curtain gas to each station in the chamber during film deposition according to the process conditions determined in (a); determining, during or after (b), an adjusted flow condition of the curtain gas in the chamber to improve substrate nonuniformity; and flowing, after (c), the curtain gas during film deposition according to the adjusted flow condition determined in (c).

In some embodiments, the flow condition of the curtain gas may be a flowrate of the current gas, and the adjusted flow condition of the curtain gas may be an adjusted flowrate of the curtain gas.

In some further embodiments, the curtain gas may be flowed at a substantially constant flowrate during (d).

In some other further embodiments, the curtain gas may be flowed at a variable flowrate during (d).

In some embodiments, the flow condition of the curtain gas may be a partial pressure of the curtain gas, and the adjusted flow condition of the curtain gas may be an adjusted partial pressure of the curtain gas.

In some embodiments, the process conditions may include a pressure of the chamber, and the adjusted flow condition of the curtain gas in the chamber may be caused by an adjusted pressure of the chamber.

In some embodiments, the process conditions may include an evacuation rate of the chamber, and the adjusted flow condition of the curtain gas in the chamber may be caused by an adjusted evacuation rate of the chamber.

In some embodiments, the flow condition of curtain gas may be a flowrate of the current gas and a partial pressure of the current gas, the process conditions may include a pressure of the chamber and an evacuation rate of the chamber, and the adjusted flow condition of the curtain gas in the chamber may be more than one of an adjusted flowrate of the curtain gas, an adjusted partial pressure of the curtain gas, caused by an adjusted pressure of the chamber, and caused by an adjusted evacuation rate of the chamber.

In some embodiments, (d) may be performed during a phase of the film deposition.

In some further embodiments, (d) may be performed during one or more of the following phases of film deposition exposing substrates in each station to a precursor of material, removing at least some of the precursor from the chamber, activating a reaction of the precursor on each substrate, and removing, after the reaction, at least some of the gases in the chamber.

In some embodiments, (d) may be performed during all phases of the film deposition.

In some further embodiments, (d) may be performed during all of the following phases of film deposition that may include exposing substrates in each station to a precursor of material, removing at least some of the precursor from the chamber, activating a reaction of the precursor on each substrate, and removing, after the reaction, at least some of the gases in the chamber.

In some embodiments, the method may further include identifying, before (c), non-uniformity in the film deposited by one or more of the stations in the chamber and the determining of (c) may be based, at least in part, on the identifying.

In some embodiments, the adjusted flow condition of the curtain gas determined in (c) may include an adjusted oxygen concentration in the curtain gas, in comparison to the flow of the curtain gas flowed in (a).

In some further embodiments, the adjusted flow condition of the curtain gas determined in (c) may include pure molecular oxygen.

In some embodiments, the curtain gas includes a mixture of oxygen and a second component such as argon or nitrogen.

In one embodiment, a system for performing film deposition in a multi-station semiconductor processing tool may be provided. The system may include a gas delivery system a processing chamber that includes at least two stations for which each station shares the gas delivery system, and the processing chamber is configured to flow a curtain gas around the periphery of each station. The system may also include a controller for controlling the system to deposit a material on at least two substrates processed in separate stations, the controller including control logic for (a) flowing the curtain gas during film deposition to each station in the chamber according to process conditions, including a flow condition of a curtain gas that flows around the periphery of each station in the chamber, for performing film deposition in the chamber; (b) determining, during or after (a), an adjusted flow condition of the curtain gas in the chamber to improve substrate nonuniformity; and (c) flowing, after (b), the curtain gas during film deposition according to the adjusted flow condition determined in (b).

In some embodiments, the flow condition of the curtain gas may be a flowrate of the current gas, and the adjusted flow condition of the curtain gas may be an adjusted flowrate of the curtain gas.

In some embodiments, the flow condition of the curtain gas may be a partial pressure of the curtain gas, and the adjusted flow condition of the curtain gas may be an adjusted partial pressure of the curtain gas.

In some embodiments, the process conditions may include a pressure of the chamber, and the adjusted flow condition of the curtain gas in the chamber may be caused by an adjusted pressure of the chamber.

In some embodiments, the process conditions may include an evacuation rate of the chamber, and the adjusted flow condition of the curtain gas in the chamber may be caused by an adjusted evacuation rate of the chamber.

In some embodiments, the controller may further include control logic for (d) exposing substrates in each station to a precursor of material; (e) removing at least some of the precursor from the chamber; (f) activating a reaction of the precursor on each substrate; and (g) removing, after the reaction, at least some of the gases in the chamber, and wherein (c) is performed during one or more of: (d) through (g).

In some embodiments, the controller may further include control logic for: (h) determining process conditions, including the condition flow of the curtain gas, for performing film deposition in the chamber.

In some embodiments, the system may further include a substrate holder in the processing chamber and a showerhead for flowing gas into the processing chamber. The processing chamber may be further configured to flow the curtain gas from a processing chamber body, the substrate holder, or the showerhead.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Disclosed herein are methods, systems, and apparatuses for performing film deposition in a multi-station semiconductor substrate processing chamber. Some semiconductor processes are used to deposit one or more layers of a material onto a substrate such as a wafer. When used herein, "wafer" can typically be interpreted to include other forms of "substrate" such as a large format display substrate. Examples of such deposition processes include chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD").

For instance, some CVD processes may deposit a film on a substrate surface by flowing one or more gas reactants into a reactor which form film precursors and by-products. The precursors are transported to the wafer surface where they are adsorbed by the wafer, diffused into the wafer, and deposited on the wafer by chemical reactions which also generate by-products that are removed from the surface and from the reactor.

For another example, some deposition processes involve multiple film deposition cycles, each producing a "discrete" film thickness. ALD is one such film deposition method, but any technique which puts down thin layers of film and used in a repeating sequential matter may be viewed as involving multiple cycles of deposition.

As described in further detail below, a basic ALD cycle for depositing a single layer of material on a substrate in a processing chamber may include: (i) adsorbing a film precursor on a substrate such that it forms an adsorption-limited or partially adsorption-limited layer (e.g., dosing), (ii) removing (at least some, when present) unadsorbed (including desorbed) film precursor from the vicinity of the process station holding the substrate (e.g., purging), and (iii) after removing unadsorbed film precursor, reacting the adsorbed film precursor—e.g, by igniting a plasma in the vicinity of said process station—to form a layer of film on the substrate (e.g., reacting). ("Unadsorbed" film precursor, as used herein, is defined to include desorbed film precursor.) In some implementations, ALD processes do not employ truly "adsorption-limited" dose operations. The dose phase may be completed before an adsorption limit (surface saturation) is reached. Oftentimes, an ALD cycle additionally involves an operation (iv) of, after the reaction of adsorbed film precursor, removing desorbed film precursor and/or film precursor reaction by-product from the vicinity of said process station holding the substrate having been deposited upon (e.g., purging). The removing in operations (ii) and (iv) may be done via purging the vicinity of the substrate, evacuating by pumping down to a base pressure ("pump-to-base"), etc.

The plasma used to activate the surface reaction in operation (iii) is typically supported by a plasma feed gas which, for example, may be flowed into the reaction chamber through one or more showerheads (described in greater detail below). In some embodiments, the plasma feed gas may be used to purge the chamber in order to effectuate the removal in operations (ii) and (iv).

Overview of Film Deposition Apparatuses

Operations for depositing films on semiconductor substrates may generally be performed in a substrate processing apparatus like that shown in FIG. 1. The apparatus 100 of FIG. 1, which will be described in greater detail below, has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1 and will be described in further detail below. In any event, as it is described in detail below, the apparatus schematically illustrated in FIG. 1 provides the basic equipment for performing film deposition operations such as ALD on semiconductor substrates.

While in some circumstances a substrate processing apparatus like that of FIG. 1 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 2. The substrate processing apparatus 200 of FIG. 2, still employs a single substrate processing chamber 214, however, within the single interior volume defined by the walls of the processing chamber, are multiple substrate process stations, each of which may be used to perform processing operations on a substrate held in a wafer holder at that process station. In this particular embodiment, the multi-station substrate processing apparatus 200 is shown having 4 process stations 201, 202, 203, and 204. The apparatus also employs a substrate loading device, in this case substrate handler robot 226, for loading substrates at process stations 201 and 202, and a substrate transferring device, in this case substrate carousel 290, for transferring substrates between the various process stations 201, 202, 203, and 204. Other similar multi-station processing apparatuses may have more or fewer processing stations depending on the embodiment and, for instance, the desired level of parallel wafer processing, size/space constraints, cost constraints, etc. Also shown in FIG. 2, which will be described in greater detail below, is a controller 250 which also assists the goal of performing efficient substrate deposition operations such as in, for example, atomic layer deposition (ALD) operations.

Figure 2:
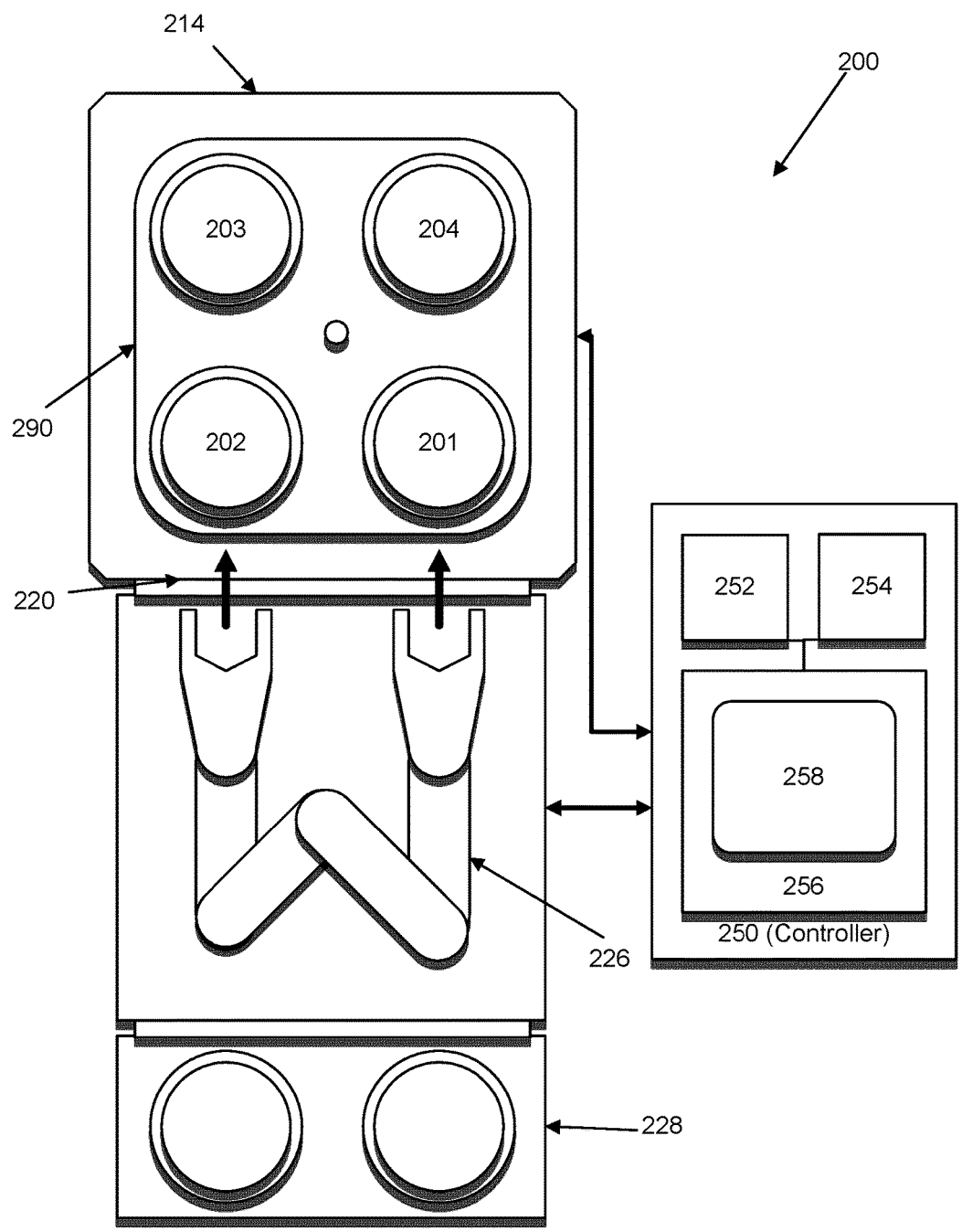
FIG. 2 depicts a schematic of a system for performing film deposition in one or more multi-station semiconductor processing tools and including a four-station substrate processing tool, a substrate handler robot for loading and unloading substrates from two process stations, and a controlling for operating the tool.

Note that various efficiencies may be achieved through the use of a multi-station processing apparatus like that shown in FIG. 2 with respect to both equipment cost and operational expenses. For instance, a single vacuum pump (not shown in FIG. 2, but e.g. 118 in FIG. 1) may be used to create a single high-vacuum environment for all 4 process stations and it may also be used to evacuate spent process gases, etc. with respect to all 4 process stations. Depending on the embodiment, each process station typically has its own dedicated showerhead for gas delivery (see, e.g., 106 in FIG. 1), but share the same gas delivery system (e.g., 101 in FIG. 1). Likewise, certain elements of the plasma generator equipment may be shared amongst process stations (e.g., power supplies), although depending on the embodiment, certain aspects may be process station-specific (for example, if showerheads are used to apply plasma-generating electrical potentials—see the discussion of FIG. 1 below). Once again, however, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

Implementations and Applications of a Curtain Gas for Volumetrically Isolating Process Stations, Reducing Spurious Chamber Wall Film Deposition, and Reducing Parasitic Plasma Generation While using larger processing chambers with multiple process stations may provide the aforementioned benefits, there are certain advantages generally associated with employing a smaller single-station processing chamber. One of these is rapid cycling of the chamber volume—being capable of rapidly introducing and removing reactants, by-products, etc. This may be particular important in ALD processes where many deposition cycles are required in order to deposit a film of appreciable thickness, and thus time-spent cycling chamber volumes may be quite significant.

Accordingly, it is desirable to combine the high plasma powers (and other benefits) associated with larger-volume multi-process station chambers with the rapid volume-cycling times associated with smaller single-process station chambers. One way of doing this is to "simulate" smaller chamber volumes within a large multi-process chamber by flowing curtains of gas between the various process stations and thereby volumetrically isolating the different process stations during film deposition operations.

For instance, during a sequence of ALD cycles, such a "curtain gas" may be flowed between the process stations to prevent intermixing of reactants, plasma feed gases, etc. while not adversely affecting the reactive film-deposition processes occurring at each process station. While this may "simulate" a smaller volume for the purposes of reactant flow and by-product purge, the advantages of a larger chamber volume remain intact with respect to high-plasma power and scaling of certain component costs. Moreover, in addition to the foregoing benefits, volumetric isolation of process stations via curtain gas flow may allow the sequence of operations making up an ALD cycle to be staggered between process stations. Various benefits associated with such staggered ALD cycling are described in detail in U.S. patent application Ser. No. 14/133,246 , filed Dec. 18, 2013, now U.S. Pat. No. 8,940,646, titled "SEQUENTIAL PRECURSOR DOSING IN AN ALD MULTI-STATION/BATCH REACTOR," hereby incorporated by reference in its entirety for all purposes.

It is noted, however, that in order for the foregoing benefits to be achieved, it is not necessarily the case that the various process stations are perfectly volumetrically isolated from one another by the curtain gas flow. In general, one would expect this not to be the case. Thus, in the context of this disclosure, "volumetrically isolating" one process station from another via curtain gas flow is to be interpreted to mean that the curtain gas flow between process stations works to significantly reduce the mixing of gases between process stations that what would occur if no such curtain gas were employed. This is to be contrasted with the "complete" or "perfect" volumetric isolation that would exist if each process station resided in its own separate process chamber; volumetrically isolating with a curtain gas does not imply or require such perfect/complete separation/isolation.

In plasma-based ALD operations, the curtain gas may be viewed as distinct from the plasma feed gas, the latter being used to support the plasma which is ignited in ALD operation (iii) (see above) to activate the reaction which causes film deposition. Note that, in some embodiments, the plasma feed gas is also used as a purge gas for removing unadsorbed film precursor (reactant) from the vicinity of the different process stations, when appropriate. Thus, while the curtain gas could (and typically would) be flowed continuously into the processing station during all the ALD cycle operations (such as operations (i)-(iv) above), the plasma feed gas would typically only be flowed to the processing chamber— and, more specifically, to the process stations—during the plasma activation (and purge operations if also used as a purge gas) while they are carried out at the specific process stations.

Note also that, depending on the embodiment, the flow rate of curtain gas into the process chamber may be different than the flow rate of plasma feed gas into the process chamber. In some embodiments, the plasma feed gas may be flowed into the process chamber at each station at a rate of about 5 to 50 standard liters/minute (SLM) per station, or more particularly about 10 to 35 SLM per station, or yet more particularly about 15 to 20 SLM per station. In some embodiments, the curtain gas may be flowed into the process chamber at a rate of about 3 to 60 SLM per station, or more particularly about 10 to 50 SLM per station, or yet more particularly about 15 to 40 SLM per station, or still more particularly about 20 to 30 SLM per station. Such curtain gas flow rates reduce (and/or prevent) back-diffusion of reactant and plasma feed gases from the vicinity of the process stations to remote areas of the processing chamber (such as the showerhead backsides).

In some embodiments, multi-station film deposition apparatuses may employ chandelier-type showerheads, one associated with each process station. Such chandelier showerheads may generally include a head portion and stem portion, the bottom surface of the head portion providing apertures for flowing film precursor (e.g., for substrate surface adsorption in ALD operation (i) above), plasma feed gas (e.g., for plasma activation in ALD operation (iii) above), and possibly a distinct purge gas into the processing chamber in the vicinity of each process station. The stem portion of the showerhead is present to support/hang the head portion above each process station within the processing chamber, and also to provide a fluidic path/connection for flowing film precursor (and/or other reactants), plasma feed gas, etc. to the apertures in the head portion. Generally, it is seen that chandelier-type showerhead designs allow for a good spatially uniform distribution of film precursor flow relative to the substrate surface, and improved in comparison to what would otherwise be achieved with just a few nozzles serving as point sources of flow.

In addition, such showerheads may also play a role in generating (and maintaining) the plasma at each process station which is used to activate the film-forming deposition reaction (e.g., in ALD operation (iii) above). In particular, upon application of a suitable electrical potential, each chandelier showerhead may serve as one of the two electrodes for plasma generation, the other electrode being the substrate holder (e.g., pedestal) between which the electrical potential is applied. The chandelier design allows positioning of the showerhead close to the substrate surface, which thereby allows for efficient plasma generation very close to the substrate as well as intended to provide a relatively spatially uniform distribution of film precursor (reactant) close to the substrate. In addition, as mentioned above, if the plasma feed gas is also used as a purge gas, then its introduction in the vicinity of the substrate allows for an efficient and effective purge of unadsorbed film precursor and/or reactant by-product (e.g., in ALD operations (ii) and (iv) above).

Because they are used for different purposes, the plasma feed gas and the curtain gas generally have different entry points into the processing chamber. While the plasma feed gas enters the chamber through apertures in the bottom surface of the head portions of the showerheads (as just described), the curtain gas may be introduced into the processing chamber from entry points suitable for its role in providing volumetric isolation for the various process stations (as well as potentially providing other benefits). For instance, for embodiments employing process-station-specific chandelier showerheads, the curtain gas may be released into the process chamber from behind the head portions of each of the chandelier showerheads, and in particular, in some embodiments, through apertures in the showerhead collars which surround the stem portions of the showerheads. Moreover, in certain such embodiments, the curtain gas may be flowed from these apertures in directions substantially parallel to the plane of the substrate and/or the bottom surfaces of the head portions, and thus, generally initially in directions perpendicular to the flow emanating from the bottom surface of the head of the showerhead. This flow of curtain gas may continue laterally until the curtain gas reaches the end of the backside of the showerhead (top surface of the head portion of the showerhead) at which point the curtain gas flow may turn downward, now substantially parallel to the flow of plasma feed and/or purge gas from the head of the showerhead.

Figure 3:
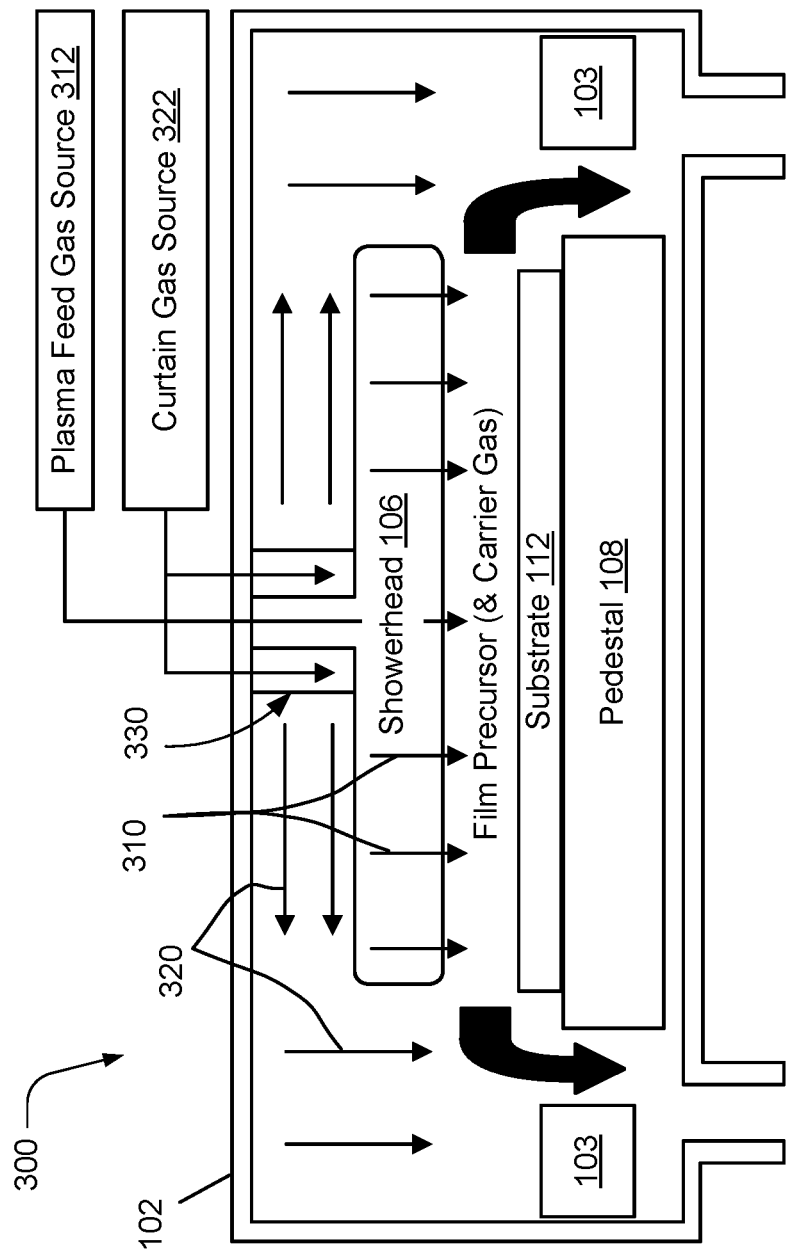
FIG. 3 depicts a cross-sectional schematic of a processing chamber of a single station substrate processing apparatus having a showerhead and showerhead collar, and featuring primary and secondary purge gas flowpaths.

As described, in a multi-station processing chamber, this flow pattern of curtain gas may be used to provide volumetric separation between process stations; however, even in the context of a single process station embodiment, there may be attendant advantages in establishing curtain gas flow from behind the head portion of the showerhead. To illustrate such a flow pattern—first in the simpler context of a single process station embodiment—FIG. 3 depicts a cross-sectional schematic of a single-station substrate processing apparatus 300 having a processing chamber 102, a showerhead 106 and showerhead collar 330, and featuring curtain gas flowpaths 320, and plasma feed gas (and reactant precursor) flowpaths 310. In the configuration shown in FIG. 3, consistent with the foregoing description, plasma feed gas from plasma feed gas source 312 is flowed into chamber 102 through the bottom surface of the head portion of showerhead 106, while curtain gas from curtain gas source 322 is flowed into chamber 102 through apertures in the showerhead collar 330 which surrounds the stem portion of showerhead 106. Thus, the curtain gas here (note the descriptive phrase "curtain gas" is retained, even in the single station context) is introduced into the processing chamber 102 near to the center axis of the backside of the showerhead 106 and introduced with a flow substantially parallel to the plane of the substrate 112 held on pedestal 108 (and substantially parallel to the bottom surface of the head portion of the showerhead 106). The curtain gas so introduced then proceeds to flow around the showerhead, around the periphery of the showerhead and station, and down the chamber sidewalls before exiting the chamber in the vicinity of cross-plates 103 (as schematically illustrated by the arrows in FIG. 3).

Even in the single-process station scenario, the flow of curtain gas directly into the space/cavity behind/above the showerhead may be quite beneficial in that it may minimize or prevent undesirable deposition at the backside of the showerhead and on chamber walls behind/above the showerhead, etc. Likewise, the flow of curtain gas down the sidewalls may work to reduce and/or prevent deposition on the interior walls of chamber 102. In some examples, the flow of curtain gas into the cavity behind a chandelier-type showerhead may satisfy a Peclet condition (typically a Peclet number greater than one) so that back diffusion (or backflow) of film precursor from the bottom surface of the showerhead into said cavity is reduced and/or prevented. A further benefit—again, even in the single-process station context—is that establishing a flow of curtain gas, prior to the introduction of film precursor, (in addition to reducing or preventing potential spurious deposition on the showerhead backside and on the chamber walls) may establish the desired chamber pressure for the reactive film deposition process, avoiding wastefully establishing the appropriate chamber pressure with an excess of expensive film precursor. I.e., the higher chamber pressure acts as an air curtain for the film precursor and thus increases the partial pressure of precursor in the substrate region while reducing precursor partial pressure elsewhere. Thus, even in the single process station embodiment, a flow of curtain gas from the showerhead backside reduces the effective chamber volume, while reducing unwanted deposition on chamber sidewalls and on the backside of the showerhead.

Figure 4:
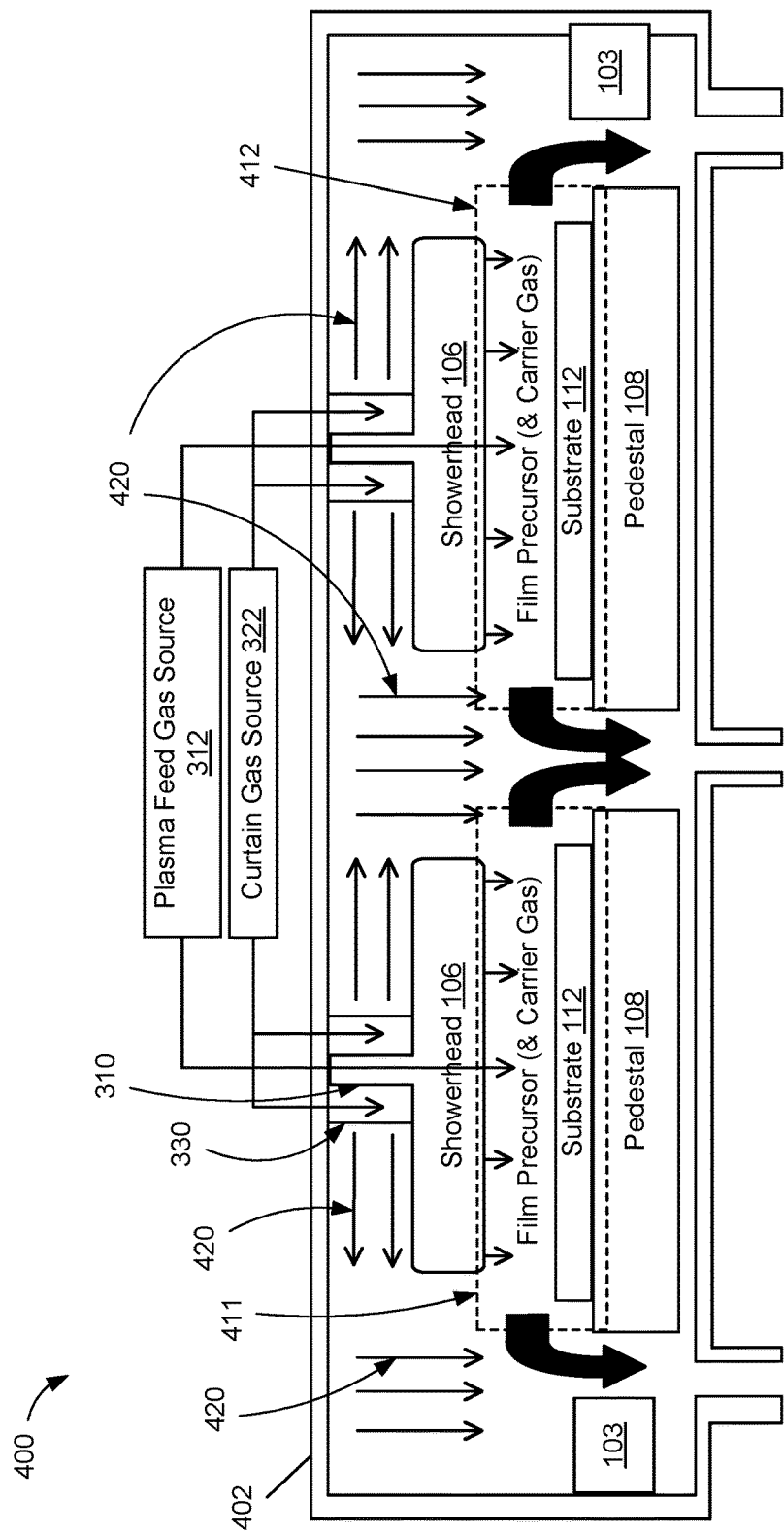
FIG. 4 depicts a cross-sectional schematic of a dual-station processing chamber of a substrate processing tool, each station having a substrate holder, a chandelier-type showerhead and an associated showerhead collar.

As discussed though, in a multi-station substrate processing chamber, the curtain gas may additionally provide volumetric isolation between process stations. FIG. 4 schematically illustrates a pair of process stations 411 and 412 (see dashed lines in FIG. 4) within a multi-station processing chamber 402 of a processing tool 400. As illustrated in the figure by arrows indicative of the direction of gas flow, in addition to the curtain gas flow pattern shown in FIG. 3 (in the context of a single station), here the curtain gas 420 additionally flows between the process stations 411 and 412 volumetrically isolating them from one another. Note that this view shows a pair of process stations in cross section, so the view could represent a 2-station processing chamber embodiment, or it could represent a cross-sectional view of a 4-station processing chamber embodiment, such as that schematically illustrated in FIG. 2. In any event, each process station of the pair shown are analogous to the single process station shown in FIG. 3, and thus the description accompanying FIG. 3 (as well as reference numbering), applies to FIG. 4 as well where appropriate, one difference being that in FIG. 4 there are a pair of process stations 411 and 412, and the pair are volumetrically isolated/separated from each other by the flow of curtain gas 420.

Certain benefits associated with the use of a curtain gas are particularly manifest in ALD process operations. For instance, curtain gas may be laterally released at the showerhead backside continuously throughout one or more of the phases/operations of an ALD cycle. Thus, while the plasma feed gas is only flowed from the showerhead during certain ALD operations—such as the plasma activation step (ALD operation (iii) above) and possibly if used as a purge gas during the post-precursor dose removal step (ALD operation (ii) above)—the curtain gas may be flowed continuously, directing curtain gas to remote areas of the chamber throughout ALD operations. Flow of the curtain gas to remote areas of the chamber—i.e., regions not in the immediate vicinity of the substrate surface—helps to remove excess unabsorbed film precursor from the processing chamber and, moreover, may even help to prevent film precursor from flowing to these remote regions of the chamber in the first instance. Again, to effect the latter, the curtain gas would then also be actively flowed during the ALD precursor dose operation (ALD operation (i) above) when film precursor is flowed to the chamber (and adsorbed on the substrate). Likewise, employment of curtain gas during plasma activation (operation (iii)) protects the interior surfaces of the chamber from any spurious deposition which might occur as a result of precursor becoming desorbed from the substrate surface during the reactive process occurring there, and then becoming re-adsorbed and reacting elsewhere, such as on the chamber sidewalls.

It is noted that suitable chandelier showerheads employable for providing plasma feed gas and curtain gas in a multi-station processing chamber—schematically similar to that illustrated in FIGS. 3 and 4—are described in greater detail below with respect to FIGS. 6-9B. The introduction of gas to a processing chamber from behind the head of a chandelier-type showerhead, and details of associated apparatuses are also described in prior U.S. patent application Ser. No. 13/659,231, filed Oct. 24, 2012, titled "SUPPRES- SION OF PARASITIC DEPOSITION IN A SUBSTRATE PROCESSING SYSTEM BY SUPPRESSING PRECURSOR FLOW AND PLASMA OUTSIDE OF SUBSTRATE REGION," published as US Pat. Pub. No. 2013/0344245 and hereby incorporated by reference in its entirety and for all purposes.

There may also be some advantages to using molecular oxygen as a curtain gas, whether solely as the curtain gas or as part of a mixture, as described in U.S. patent application Ser. No. 14/828,291, filed Aug. 17, 2015, titled "COMPOSITION-MATCHED CURTAIN GAS MIXTURES FOR EDGE UNIFORMITY MODULATION IN LARGE-VOLUME ALD REACTORS", hereby incorporated by reference in its entirety and for all purposes; as well as described in U.S. patent application Ser. No. 14/447,203, filed Jul. 30, 2014, titled "METHODS AND APPARATUSES FOR SHOWERHEAD BACKSIDE PARASITIC PLASMA SUPPRESSION IN A SECONDARY PURGE ENABLED ALD SYSTEM," published as US Pat. Pub. No. 2016/0035566 and hereby incorporated by reference in its entirety and for all purposes.

While use of molecular oxygen ($O_2$) as a curtain gas for process station isolation may deal with the problem of parasitic plasma generation generally associated with the use of an inert gas having a low breakdown voltage—argon (Ar) being one example—there may be other issues which have been discovered to arise as a result of this choice, which are discussed, along with some potential solutions to such issues, in the above-referenced patent application, U.S. patent application Ser. No. 14/828,291.

In some other embodiments, the curtain gas may be released into the process chamber from other entry points within the processing chamber, such as from the pedestal, from the showerhead, or the processing chamber itself. For example, the pedestal in a station may include apertures and/or slots along the circumferential edge and/or sidewall that are configured (e.g., fluidically connected to the curtain gas source) to release curtain gas into the process chamber. In another example, the showerhead may also include apertures and/or slots along the circumferential edge and/or a surface of the showerhead (e.g., the circumferential side or the top) that are configured to release curtain gas into the process chamber. In yet another example, the processing chamber may be configured to release curtain gas around each station. In some such embodiments, the processing chamber may include nozzles, apertures, slots, or other openings that are fluidically connected to the curtain gas source in order to flow such curtain gas and such openings may be arranged and placed within the processing chamber in order to suitably provide the volumetric isolation for the various process stations. For instance, the chamber may include a series of apertures or nozzles arranged in a circular pattern above each process station such that curtain gas may flow into the process chamber and around each process station.

Figure 12:
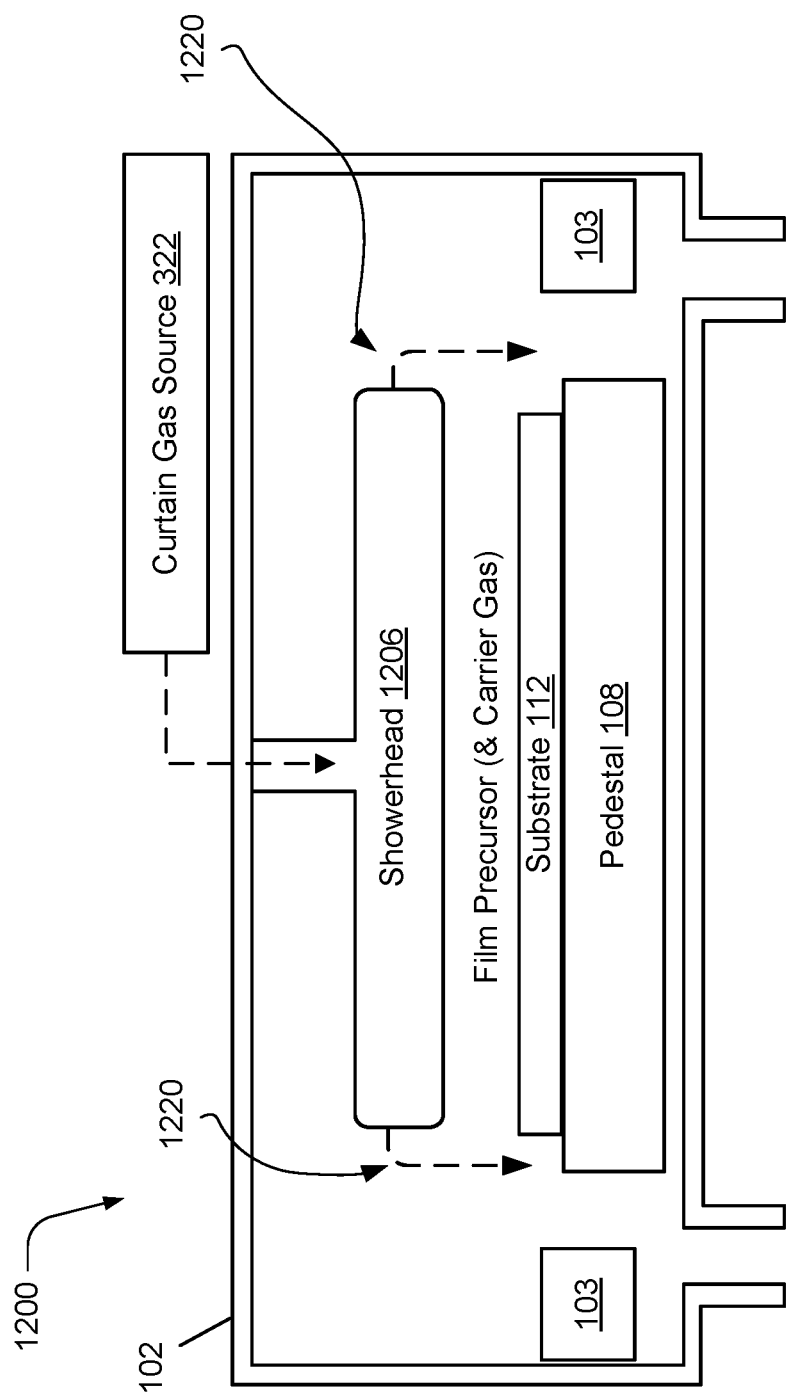
FIG. 12 depicts an example processing chamber that includes a showerhead configured to release curtain gas into the process chamber.

FIG. 12 depicts an example processing chamber that includes a showerhead configured to release curtain gas into the process chamber. As can be seen, FIG. 12 includes an apparatus 1300 with a processing chamber 102 and a showerhead 1206, as well as some of the features described and included in FIG. 3. The showerhead 1206 is fluidically connected to curtain gas source 322 and is configured to flow curtain gas 1220, identified with dashed lines, into the processing chamber. FIG. 12 is intended to show the general concept of curtain gas flowing from showerhead 1206 and therefore, some of the features depicted in FIG. 12 are similar and/or identical to those in FIG. 3 and some have been omitted for illustrative purposes, such as the showerhead collar. The curtain gas flow may emanate from any portion or portions of the showerhead, such as the circumferential side wall, the top, or the bottom.

Figure 13:
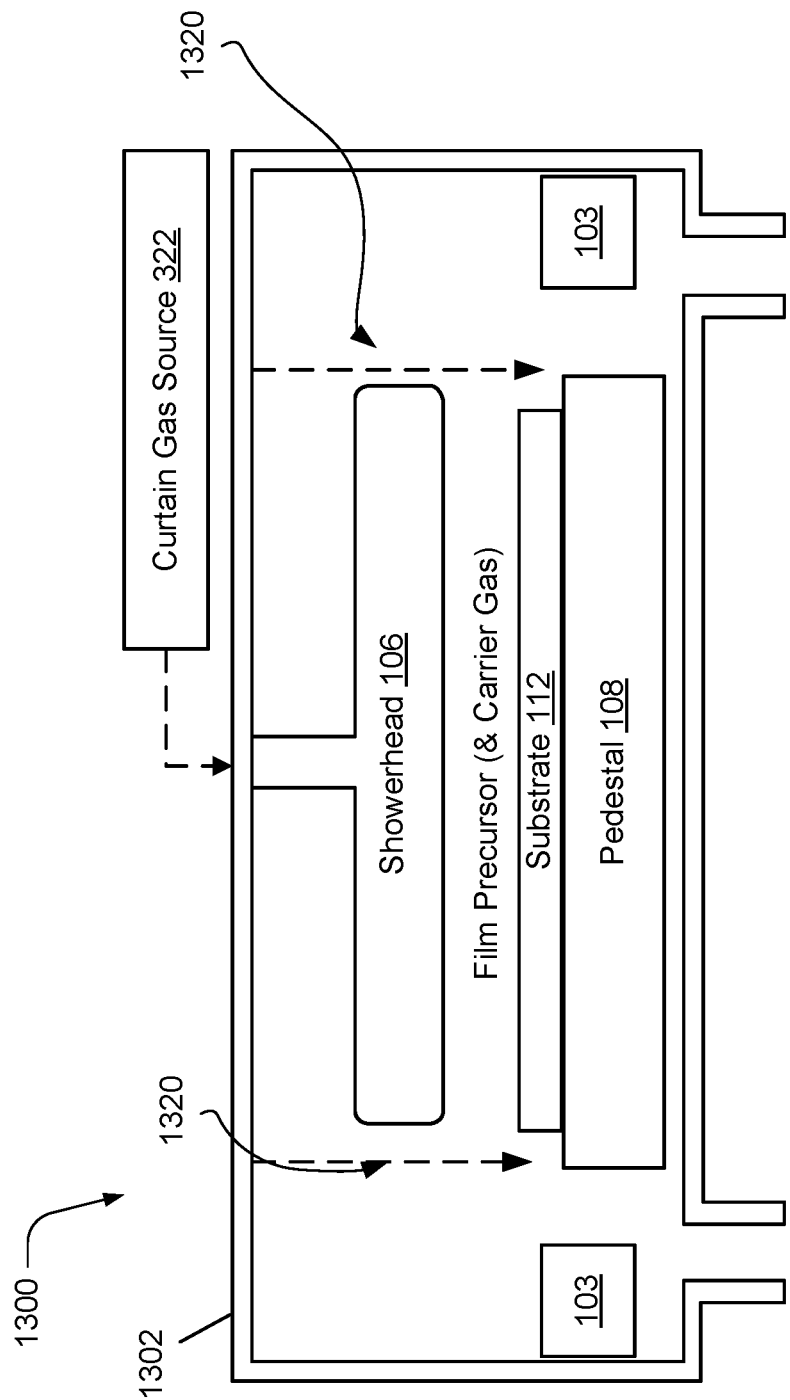
FIG. 13 depicts a second example processing chamber that is configured to release curtain gas into the process chamber.

Similarly, FIG. 13 depicts a second example processing chamber that is configured to release curtain gas into the process chamber. FIG. 13 includes an apparatus 1300 with a processing chamber body 1302 as well as some of the features described and included in FIG. 3. The processing chamber 1302 is fluidically connected to curtain gas source 322 and is configured to flow curtain gas 1320, identified with dashed lines, into the processing chamber. FIG. 13 is intended to show the general concept of curtain gas flowing from the processing chamber body, e.g. the top of the processing chamber, and therefore, some of the features depicted are similar and/or identical to those in FIG. 3 and some have been omitted for illustrative purposes, such as the showerhead collar.

Figure 14:
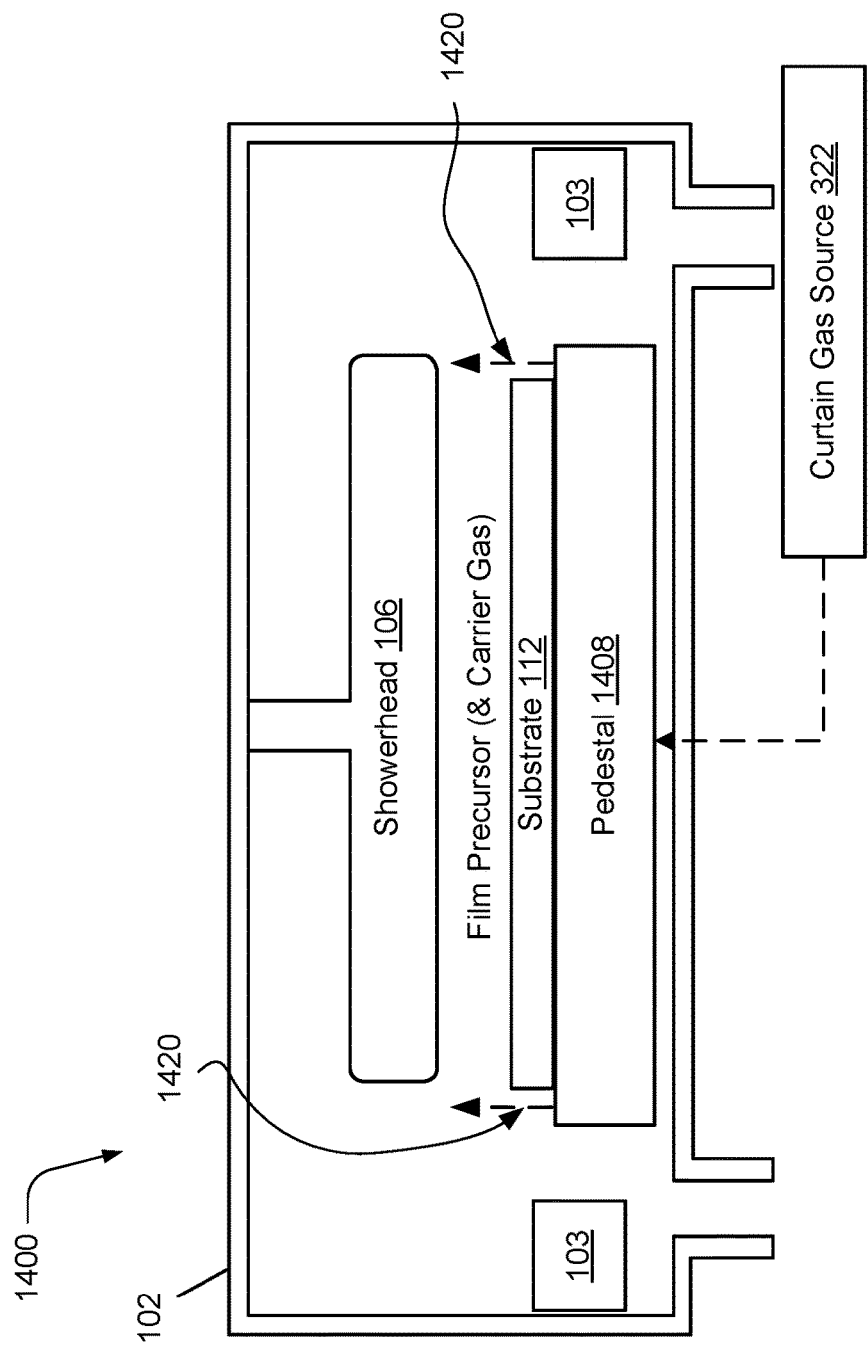
FIG. 14 depicts a third example processing chamber that includes a pedestal configured to release curtain gas into the process chamber.

FIG. 14 depicts a third example processing chamber that includes a pedestal configured to release curtain gas into the process chamber. As can be seen, FIG. 14 includes an apparatus 1400 with a pedestal 1408 as well as some of the features described and included in FIG. 3. The pedestal 1408 is fluidically connected to curtain gas source 322 and is configured to flow curtain gas 1420, identified with dashed lines, into the processing chamber. FIG. 14 is intended to show the general concept of curtain gas flowing from the pedestal 1408, e.g. the top of the processing chamber, and therefore, some of the features depicted are similar and/or identical to those in FIG. 3 and some have been omitted for illustrative purposes, such as the showerhead collar.

Improving Nonuniformity of a Substrate Using Curtain Gas

Nonuniformity of a deposited layer or layers of material near the edge of a substrate is a persistent problem in semiconductor processing. One measure of nonuniformity is referred to as "half range nonuniformity", also referred to as NU % (R/2), which is defined as $\frac{1}{2}*(\max_{thickness}-\min_{thickness})/\text{mean}_{thickness}*100\%$. Such nonuniformity measurement examines the thickness of a material deposited on a substrate from the dead center of the substrate in a radial direction to the edge of the substrate, referred to herein as "radial thickness." Therefore, "radial thickness nonuniformity" as used herein refers to the half range nonuniformity of the thickness of the material deposited on the substrate in the radial direction from the dead center of the substrate to the edge of the substrate.

Many typical reactors, such as CVD and ALD reactors, use a showerhead to deliver both the precursor and reactant gas to the chamber. Showerheads are intended to uniformly distribute the reactants over the whole surface of the substrate, however, in practice it is difficult to ensure uniform distribution of the reactants flowing through a showerhead because of the complex fluid dynamics is a process chamber. Accordingly, many typical showerheads do not consistently and uniformly distribute the reactants over the whole surface of the substrate thereby allowing radial thickness nonuniformity to exist. The largest nonuniformity is often observed at the far edge of the substrate, which may be, for example, an area about 0-3 millimeters radially inwards from the edge of the substrate.

Figure 5:
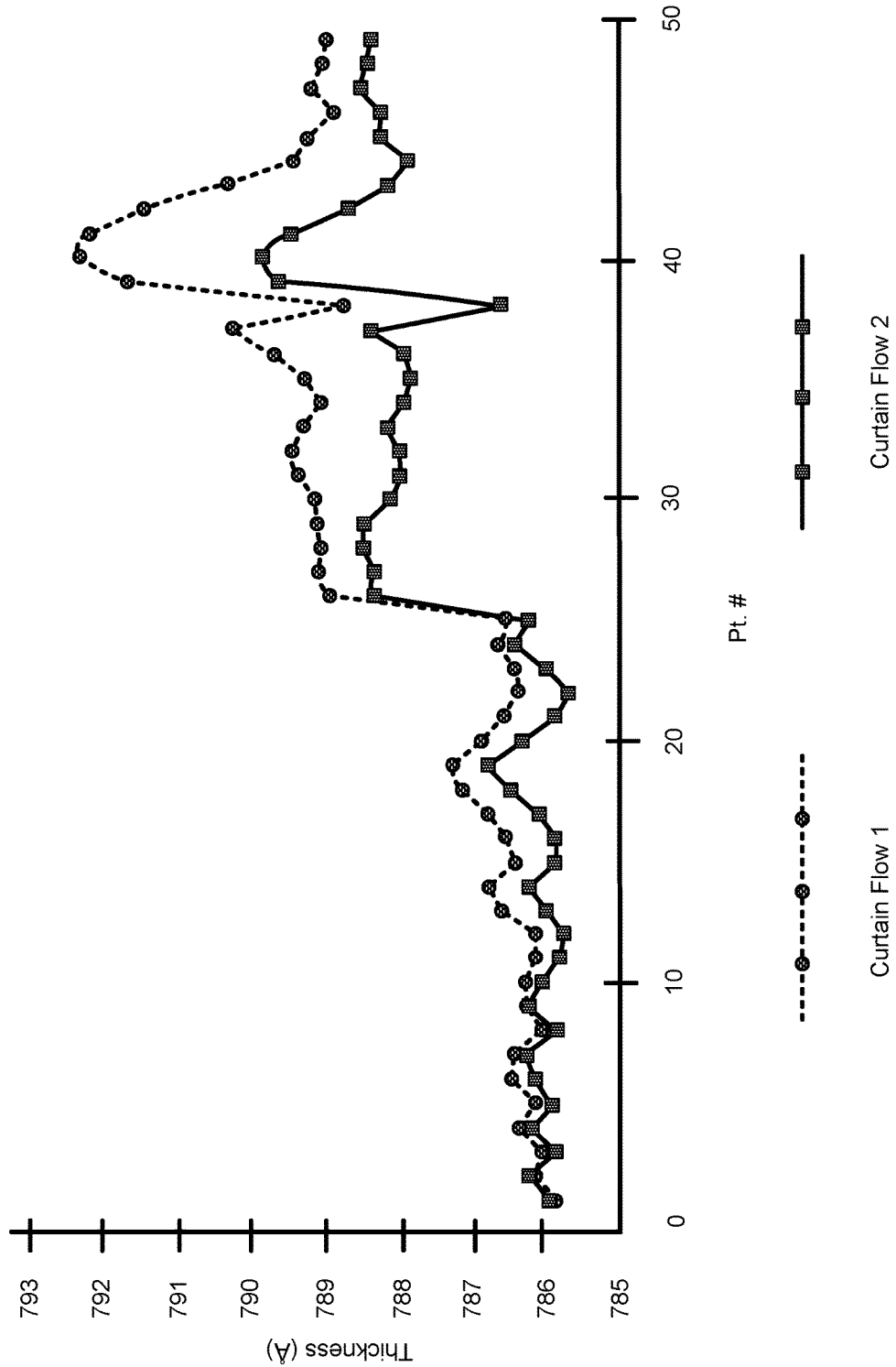
FIG. 5 depicts a graph of measured thicknesses of two substrates using two different curtain gas flows.

FIG. 5 depicts a graph of measured thicknesses of two substrates using two different curtain gas flows. The vertical axis depicts thickness measured in Angstroms (Å) and the horizontal axis depicts the number of measurement points along the substrate in a general radial direction from the dead center of the substrate, point 1, to the edge of the substrate, point 50, i.e. radial thickness. Specifically, point 1 is the center, points 2-9 are azimuthally separated at a radius of about 49 mm, points 10-25 are azimuthally separated at a radius of about 98 mm, and points 26-49 are azimuthally separated at a radius of about 147 mm. The data for Curtain Flow 1 (identified with circle measurement points and a dashed line) is for ALD deposition on a substrate under typical process conditions. Curtain Flow 2 will be discussed in greater detail below. As can be seen for Curtain Flow 1, the radial thickness of the substrate deviates more at points farther away from the center of the substrate with the greatest variation between thicknesses around measurement points 36-47, i.e., the radial thickness increases as the distance from the substrate center increases radially towards the substrate edge. For example, areas of radial thickness nonuniformity can be seen between the two groups of measurement points, 0-26 and 27-49. The thickness at measurement points 39, 40, and 41, for instance, also varies significantly from the thickness at many other measurement points, such as measurement points 0-25 and 26-34. The thickness variations of Curtain Flow 1 result in a NU % (R/2) of approximately 0.41%.

Figure 10:
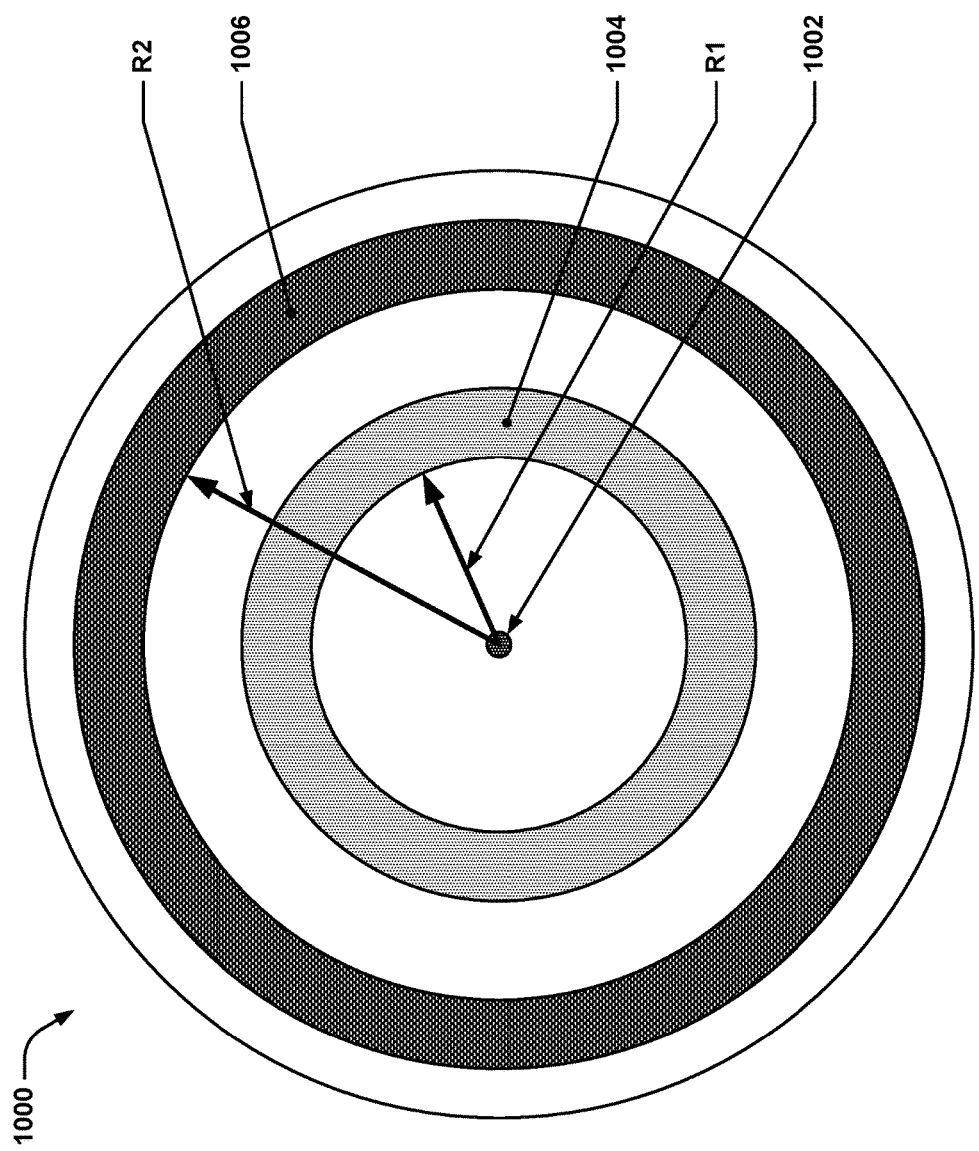
FIG. 10 depicts a top view of an example substrate illustrating different processing surface areas (radially defined) between which local process conditions may vary.

Because the wafer surface area available for die production increases with radial distance from the wafer center, nonuniformity towards the edge of the substrate, including the area about 0-3 millimeters radially from the edge of the substrate, presents a special challenge. FIG. 10 illustrates the different processing surface regions of a substrate. As can be seen, a top view of a substrate 1000 is shown with two shaded areas: at a first radial distance R1 from the center point 1002, a first example circumferential surface area 1004, identified with light shading, can be seen; at a second radial distance R2 from the center point 1002, a second example circumferential surface area 1006, identified with dark shading, can be seen. Each example circumferential surface area has the same radial thickness (not identified). Because the second radial distance R2 is greater than the first radial distance R1, the second example circumferential surface area 1006 has a greater surface area than the first example circumferential surface area 1004, thus allowing for more dies to be produced in the second example circumferential surface area 1006 and resulting in a greater yield than in the first example circumferential surface area 1004.

Currently, when a process is found to produce unacceptable non-uniformity, a process or design engineering team must propose and test multiple solutions, design a revised process recipe for production, validate the revision, and implement it in deployed and/or new production equipment. This costly and laborious process can easily take one to two months, time during which fabrication equipment may need to be taken off line. Techniques for addressing nonuniformity might include altering or more of the following: the reactant and/or precursor gas types and gas mixtures (e.g., different gases or mixtures, different partial pressures, etc.), plasma power, plasma frequency, pedestal temperature, movement of the carrier ring (i.e., a ceramic ring located that rests on the pedestal and encircles the substrate), and the form factor of the power distributed to one or more stations in the multi-station semiconductor processing tool. These process condition adjustments generally will not improve, or significantly improve, nonuniformity near the substrate edge because, for instance, these adjustments are not targeted at the substrate edge.

Moreover, most process conditions in a deposition process are typically dependent upon one another such that if process parameter A is adjusted to compensate for the difference in process response B, such adjustment may unintentionally impact the effects of process response C. For example, the temperature in the stations may be adjusted to improve nonuniformity, but this change in temperature may also impact film stress. Therefore, adjusting one or more process conditions is a very complex and difficult optimization problem that involves highly correlated variables.

If nonuniformity correction involves a hardware redesign such as a showerhead redesign, three or more months may be needed due to the required redesign, fabrication, installation in the multi-station semiconductor processing tool, and process development (e.g., development and optimization of process conditions) with the new showerhead. Therefore, this costly and time-intensive hardware redesign is also not a desirable technique for addressing radial thickness nonuniformity.

In certain embodiments, radial thickness nonuniformity is improved by making adjustments to the secondary gas, i.e., curtain gas, flowing around each station such that the curtain gas influences deposition near the edge of the wafers and the adjustments to it reduce nonuniformity, particularly near the edges of the wafers. In this context, the curtain gas flow around each station may be considered part of the process conditions in the processing chamber and/or in each station such that this adjusting may act as an additional "knob" for adjusting process conditions in the processing chamber and/or station. In some embodiments of the present disclosure, the curtain gas may act like a second plenum of the showerhead. The apparatuses, systems, and techniques in this disclosure may apply to any fluid phase deposition processes, including those described above, such as CVD, PECVD, and ALD (plasma and thermal).

As discussed above, the curtain gas may flow in a generally vertical downwards direction that may be substantially perpendicular to the plane of the substrate on the pedestal (e.g., similar to flowpaths 420 in FIG. 4) around the periphery of the station (e.g., around the circumference of the station). Although FIGS. 3 and 4 depict the curtain gas flow as a linear flowpath, it is to be understood that such representation is not of the actual curtain gas flowpaths. Rather, the curtain gas flowpath may be linear, nonlinear, or a combination of these. The curtain gas flow may also be laminar, turbulent, or transitional flow. Additionally, the some of the curtain gas may flow inwards towards the center of the substrate.

Figure 11:
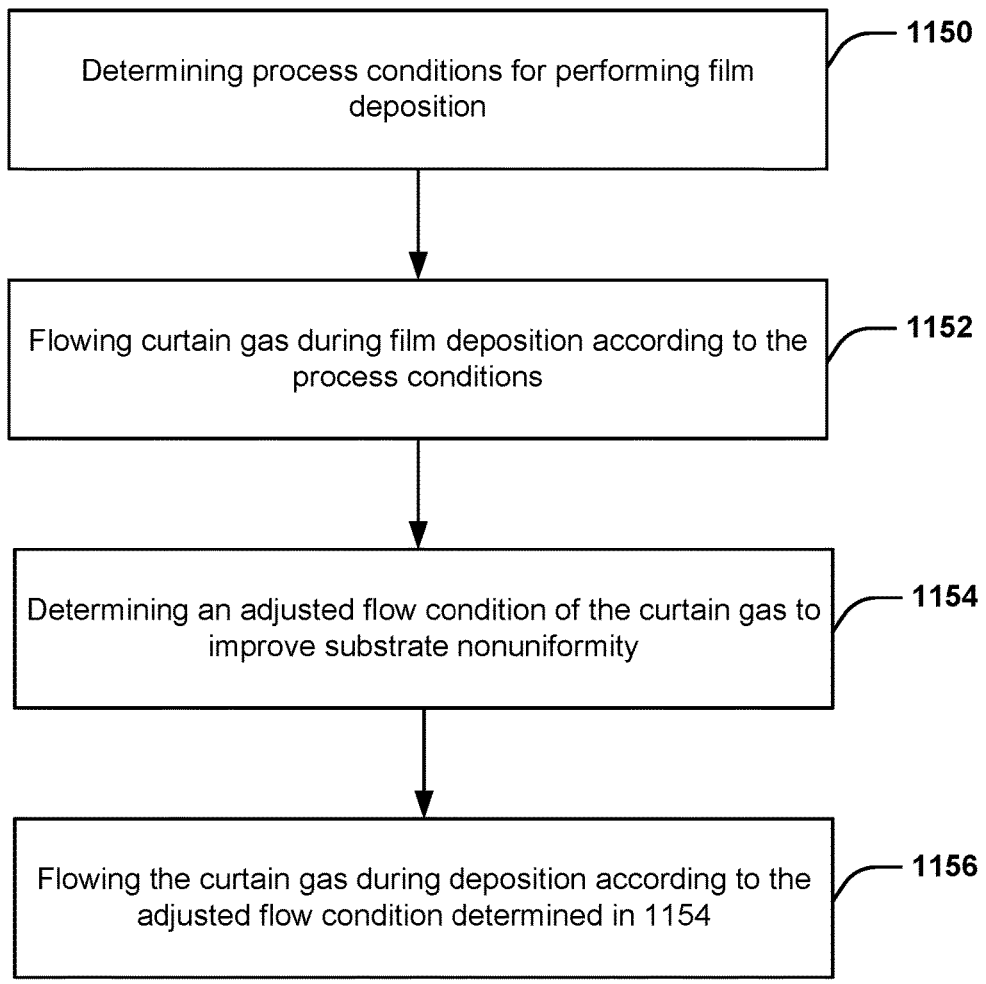
FIG. 11 depicts a flowchart of a first example technique for performing film deposition in a multi-station semiconductor processing chamber and/or processing tool.

An example technique for performing film deposition in a multi-station semiconductor processing tool using curtain gas to improve nonuniformity will now be discussed. FIG. 11 depicts a flowchart of a first example technique for performing film deposition in a multi-station semiconductor processing chamber and/or processing tool. Block 1150 includes determining the process conditions for performing film deposition. Such process conditions include, for example, the plasma power, plasma frequency, process gas (delivered through the showerhead) conditions, and curtain gas conditions. These and other conditions of film deposition are discussed in greater detail below. Process conditions of the curtain gas include its hydrodynamic conditions (e.g., volumetric flow rate into the chamber, linear flow velocity at any of various locations, flow path, and turbulence) and its composition, which may be represented as partial pressures and/or flow rates of the various gas components such as an inert gas like argon or nitrogen, a reactive gas like molecular oxygen ($O_2$), and film precursor like trimethyl aluminum (TMA). These conditions of the curtain gas may also be determined and/or affected by other process conditions within the chamber, such as the overall pressure of the chamber and an evacuation rate (e.g., pump-to-base rate) of the chamber. For example, a change in the pressure of the chamber may affect the flow of the curtain gas by changing its velocity and/or flow path. In some embodiments, the initial process conditions may be determined computationally and/or experimentally.

After the process conditions are determined, film deposition may be performed as represented in block 1152. As shown, film deposition includes flowing the curtain gas to each station in the chamber during film deposition according to the previously-determined process conditions, including the conditions of the curtain gas, such as type of gas or gas mixture, flowrate, and partial pressures of the curtain gas components. For instance, for a four station process chamber having a volume comparable to the Striker™ (formerly Vector™) deposition reactor available from Lam Research of Fremont Calif., the curtain gas may be flowed into the process chamber at a rate of about 3 to 60 standard liters/minute (SLM) per station, about 10 to 50 SLM per station, about 15 to 40 SLM per station, or about 20 to 30 SLM per station. Block 1152 may be performed during some or all parts of the performance of film deposition, such as described above. For example, the curtain gas in an ALD deposition process may be flowed only during the reaction operation (iii) while in another ALD deposition process, the curtain gas may be flowed during the adsorption (i) and reaction (iii) phases. It may also flow during a purge step. In embodiments where the curtain gas flows during all phases of a deposition process, it may flow under constant conditions (hydrodynamic and composition) or it may vary from one phase to the next.

Block 1154 includes determining an adjusted flow condition of the curtain gas in the chamber to improve substrate nonuniformity. In some implementations, this is performed after block 1152 and in some other implementations it is performed during block 1152. One or more flow conditions of the curtain gas may be adjusted in various direct and indirect ways. For example, the flowrate of the curtain gas into the chamber may be increased or decreased from the flowrate of the curtain gas in block 1152. Note that over the course of a deposition process (e.g., depositing a single film by CVD or ALD), the flow conditions of the curtain gas may be constant or may vary. In various embodiments, the flow conditions of the curtain gas and the adjusted flow conditions of the curtain gas may vary during an entire film deposition, may vary from phase to phase of a multi-phase deposition process, and may vary within a particular phase. In some embodiments, the adjusted flowrate (and/or the initial flow rate) of the curtain gas is substantially constant (e.g., within +/−5% of the set flowrate) throughout one or more phases of a multiphase deposition process and during each phase. For instance, in an ALD process in which the curtain gas is flowed during the reaction phase (iii), the adjusted flowrate of the curtain gas may be a constant flowrate throughout the entire course of reaction phase (iii). In some other embodiments, the adjusted flowrate of the curtain gas may be flowed at one or more variable flowrates during one or more phases of the deposition process.

Additionally, the adjustments to the flow conditions of the curtain gas may be applied to a deposition process in a variety of ways. For example, the adjustment may apply to the entire deposition process, may apply only for a portion of the deposition process, such as a portion of a CVD process, may apply only for one or some phases of a multi-phase deposition process, such as ALD, and may apply within one or more phases of a multi-phase ALD process. For instance, in an ALD process in which the curtain gas is flowed during the adsorption phase (i) and the reaction phase (iii), the adjusted flowrate of the curtain gas may be flowed only during the reaction phase (iii). In another instance the adjusted flowrate of the curtain gas may be flowed during the first half of a reaction phase (iii) while the curtain gas is flowed according to the initial process conditions during the second half of the same reaction phase (iii).

As suggested, the composition of the curtain gas may be adjusted to improve uniformity. This may be accomplished by changing the ratio of components in the curtain gas. It may also be accomplished by adding one or more components to and/or subtracting or more components from the initial curtain gas. Such composition changes are reflected in the partial pressures and/or flow rates of the various components of the curtain gas. As is commonly known, the partial pressure of an individual gas is the total pressure of the gas multiplied by the mole fraction of the gas; the partial pressure for a mixture of gases is the sum of the partial pressures of each individual gas of the mixture. Therefore, the partial pressure of the curtain gas may be adjusted by changing the pressure and/or mole fraction of the one or more gases making up the curtain gas. Accordingly, the adjusted condition of the curtain gas may be a composition adjustment, which may be reflected a change in mole fractions, partial pressures, flow rates, etc.

As suggested, in certain embodiments, adjustment to the curtain gas composition includes changing one or more components of the curtain gas. This may include substituting one single-component curtain gas for another single-component curtain gas, replacing a single-component curtain gas for a gas mixture, replacing one gas mixture with a different gas mixture (with or without the addition of a new component or subtraction of an existing component), or replacing a gas mixture with a single-component gas. As examples, the curtain gas may be adjusted from a gas, like argon, to molecular oxygen; or the curtain gas may be adjusted to a mixture of oxygen plus argon or nitrogen. Similarly, the adjusted curtain gas may include the same components as the initial curtain gas, but have an adjusted concentration of one or more component gases. For example, such adjusted flow condition of the curtain gas may be an adjusted oxygen concentration in the curtain gas such that the oxygen concentration in 1152 is different than the adjusted oxygen concentration in block 1154.

As noted above, certain conditions of the curtain gas may be indirectly affected, and therefore adjusted, by adjusting another process condition such as an overall condition of the chamber. In other words, an adjustment to a process condition may cause an adjustment of one or more conditions of the curtain gas. For example, adjusting the total pressure of the chamber may change a flow condition of the curtain gas such as linear flowrate, flow path (trajectory), etc. In some embodiments, as noted herein, chamber pressure may range from between about 10 mTorr and 10 Torr, or between about 20 mTorr and 8 Torr, or between about 50 mTorr and 5 Torr, or between about 100 mTorr and 2 Torr. In some embodiments, the adjustments to chamber pressure may be made within these pressure ranges. In certain embodiments, the adjustment of the chamber pressure is between about 5% and about 20% of the initial pressure. In certain embodiments, the adjustment of the chamber pressure is between about 100 mTorr and about 400 mTorr.

The adjusted flow condition of the curtain gas may also be caused by an adjusted evacuation rate of the chamber. As stated above, the chamber may be evacuated during one or more operations of a deposition process in order to remove gases and/or particles from the chamber, to pump down the chamber pressure, and/or to maintain the pressure chamber. The evacuation of the chamber is typically done at a particular rate or rates and a change in this evacuation rate (e.g., by increasing the pumping speed of the evacuation pump or pumps) may affect one or more flow conditions of the curtain gas flow. For instance, an increase in the evacuation rate while the curtain gas is also flowing may increase the flowrate of the curtain gas within the chamber.

In some embodiments, the adjusted condition of the curtain gas of block 1154 may include more than one of the aforementioned adjustments, i.e., an adjusted flowrate of the curtain gas, an adjusted composition of the curtain gas, an adjusted pressure of the chamber, and/or caused by an adjusted evacuation rate of the chamber.

In certain embodiments, one or more of the adjusted flow conditions of the curtain gas discussed herein are adjustments that improve the radial thickness nonuniformity of a deposited layer or layers on a substrate. For example, referring back to FIG. 5, Curtain Flow 2 (identified with square measurement points and a solid line) depicts radial thicknesses produced after the flow condition, specifically the flowrate, of the curtain gas of Curtain Flow 1 was adjusted to a higher flowrate such that the flowrate of Curtain Flow 2 is higher than the flowrate of Curtain Flow 1. The compositions of Curtain Flow 1 and Curtain Flow 2 are both 100% molecular oxygen. As can be seen, the radial thickness nonuniformity of Curtain Flow 2 is reduced as compared to Curtain Flow 1; here the NU % (R/2) is 0.26%, as compared to 0.41% for Curtain Flow 1. Furthermore, radial thickness nonuniformity reductions were achieved around, for example, measurement points 11-24 and 25-50. Moreover, the maximum variation of Curtain Flow 1 was approximately 6 Å (between a low of about 786 Å and a high of about 792 Å) while the maximum variation of Curtain Flow 2 was approximately 4 Å (between a low of about 786 Å and a high of about 790 Å).

In various embodiments, during production, the deposit uniformity is monitored or tested to determine whether a curtain gas adjustment is needed, and, if so, how much adjustment is needed. The monitoring or testing may be conducted continuously or intermittently. It may be conducted by in situ testing (within the deposition chamber) or by post-deposition metrology (in line). In line testing may be conducted between production runs, wafer batches, or individual wafers during batch. This monitoring may lead to the identification of nonuniformity in one or more substrates. Accordingly, some embodiments of the first example technique may include the additional aspect of identifying, before block 1154, nonuniformity in the film deposited by one or more of the stations in the chamber and having the adjusted flow condition of the curtain gas of 1154 based, at least in part, on this identification. As noted, this identifying may occur in line or in situ.

Referring back to FIG. 11, it should also be noted that blocks 1150, 1152, and/or 1154 may be performed in an experimental setting as opposed to a regular fabrication setting. For instance, an initial determination and setting of process conditions for film deposition may be made, e.g., block 1150, after which one or more deposition processes may be performed, e.g., block 1152. Following the one or more deposition processes, measurements may be made in order to adjust and optimize the process conditions, such as adjusting one or more flow conditions of the curtain gas, e.g., block 1154, for the particular deposition process. Additional iterations of blocks 1150, 1152, and/or 1154 may occur until the desired process conditions are determined for the particular deposition process. Then, after these experimental steps, the determined process conditions may be used for substrate fabrication or manufacturing. Of course, the adjusted process conditions may be determined as fabrication proceeds.

Block 1156 includes flowing the curtain gas during film deposition according to the adjusted flow condition determined in block 1154. The flowing of curtain gas according to the adjusted flow condition may occur, as referenced above, during substrate fabrication or manufacturing. In some embodiments, flowing the adjusted curtain gas may be performed during the entire film deposition process. In other embodiments, flowing the adjusted curtain gas is performed during only one or more portions of the film deposition process. During other portions, the initial curtain gas flow is used. In the context of ALD or other multi-phase deposition process, block 1156 may be performed during the following phases of film deposition: exposing substrates in each station to a precursor of material (e.g., (i) above), removing at least some of the precursor from the chamber (e.g., (ii) above), activating a reaction of the precursor on each substrate (e.g., (iii) above), and removing, after the reaction, at least some of the gases in the chamber (e.g., (iv) above). In some other embodiments, the adjusted curtain gas may be used during one or more phases of the CVD or ALD processes, such as one phase of those phases listed herein e.g., (i)-(iv). Other phases may be performed with the unadjusted curtain gas.

In some other embodiments, blocks 1152, 1154, and/or 1156 are performed during the fabrication or manufacturing of semiconductor devices on substrates. In such embodiments, film deposition may occur during manufacturing of devices, including flowing the curtain gas during film deposition according to the process conditions (e.g., block 1152), and at a point during the film deposition one or more flow conditions of the curtain gas may be adjusted to improve the substrate nonuniformity (e.g., block 1154). For example, for an ALD process, the flowing of the curtain gas according to the process conditions may occur for a first number of deposition cycles, after which the flowing of the curtain gas according to the adjusted flow may occur for a second number of deposition cycles (e.g., block 1156).

In some embodiments, the adjusted flow of the curtain gas may employ pure molecular oxygen. In some embodiments, the curtain gas may include a mixture of oxygen and a second component, such as an inert gas like argon or nitrogen. The adjusted flow may include an adjusted oxygen concentration such that the oxygen concentration flowed in block 1152 is different than the adjusted oxygen concentration in blocks 1154 and 1156. The adjusted flow of the curtain gas may also employ pure molecular oxygen.

Detailed Description of Substrate Processing Systems

The methods and techniques described herein may be performed with any suitable system for performing film deposition in a multi-station semiconductor processing tool (e.g., any suitable semiconductor substrate processing apparatus), including those described in at least two of the aforementioned and incorporated patent applications titled "COMPOSITION-MATCHED CURTAIN GAS MIXTURES FOR EDGE UNIFORMITY MODULATION IN LARGE-VOLUME ALD REACTORS" and "METHODS AND APPARATUSES FOR SHOWERHEAD BACKSIDE PARASITIC PLASMA SUPPRESSION IN A SECONDARY PURGE ENABLED ALD SYSTEM." A system for performing film deposition in one or more multi-station semiconductor processing tools includes hardware for accomplishing the process operations and a system controller having (or having access to) machine-readable instructions for controlling process operations in accordance with the processing techniques disclosed herein.

Thus, in some embodiments, a system suitable for depositing films of material on multiple semiconductor substrates may include a first set of one or more process stations each having a substrate holder contained in a processing chamber, a second set of one or more process stations each having a substrate holder contained in the processing chamber, one or more valves for controlling flow of film precursor to the process stations, and one or more valve-operated vacuum sources for removing film precursor from the volumes surrounding the process stations contained in the one or more processing chambers. And, such a system may also include a controller having (or having access to) machine-readable instructions for operating the substrate loading device, the substrate transferring device, the one or more valves, and the vacuum source to deposit films of material onto the substrates.

Therefore, in some embodiments, said instructions executed by the controller may include instructions for forming films on multiple substrates at multiple process stations contained in a processing chamber, wherein multiple layers of the film are formed on each substrate by a sequence of ALD cycles. Thus, in certain such embodiments, said instructions executed by the controller may include instructions for performing ALD operations (i) though (iv) as described above, and instructions for repeating ALD operations (i) through (iv) multiple times to form multiple layers of film on the multiple substrates at the multiple process stations of the substrate processing apparatus.

Accordingly, FIG. 1 schematically shows an embodiment of a substrate processing tool 100 which may be part of the system. For simplicity, the tool 100 is depicted as a stand-alone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an embodiment of a system that includes a multi-station processing tool. Further, it will be appreciated that, in some embodiments, one or more hardware parameters of processing tool 100, including those discussed in detail herein, may be adjusted programmatically by one or more system controllers that is part of the system.

Process chamber 102 fluidly communicates with reactant delivery system 101 for delivering process gases to a distribution showerhead 106. Reactant delivery system 101 includes a mixing vessel 804 for blending and/or conditioning process gases for delivery to showerhead 106. One or more mixing vessel inlet valves 120 may control introduction of process gases to mixing vessel 804.

Some reactants may be stored in liquid form prior to vaporization and subsequent delivery to the process chamber 102. The embodiment of FIG. 1 includes a vaporization point 103 for vaporizing liquid reactant to be supplied to mixing vessel 804. In some embodiments, vaporization point 103 may be a heated liquid injection module. In some embodiments, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 103 may be heat treated. In some examples, mixing vessel 804 may also be heat treated. In one non-limiting example, piping downstream of vaporization point 103 has an increasing temperature profile extending from approximately 100° C. to approximately 150° C. at mixing vessel 804.

As mentioned, in some embodiments the vaporization point 103 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 106.

In some embodiments, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

The gas delivery system 101 may also be configured to flow and deliver a curtain gas to the processing chamber 102. Some such configurations may include piping, valves, and a curtain gas source. As described herein and shown in at least FIGS. 3, 6, and 12-14, the system suitable for depositing films of material on multiple semiconductor substrates, including the processing chamber, may be configured to flow a curtain gas into the processing chamber from entry points suitable for its role in providing volumetric isolation for the various process stations, as well as providing other benefits such as those described herein, such as from behind the head portions of each of the chandelier showerheads, from the pedestal, from the showerhead, and/or from the chamber body (e.g., a top wall of the chamber).

Showerhead 106 distributes process gases and/or reactants (e.g., film precursors) toward substrate 112 at the process station, the flow of which is controlled by one or more valves upstream from the showerhead (e.g., valves 120, 120A, 105). In the embodiment shown in FIG. 1, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some embodiments, a microvolume 107 is located beneath showerhead 106. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some embodiments, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 108 may allow a plasma density to be varied during plasma activation and/or treatment cycles included, for example, in an ALD or CVD process. At the conclusion of a deposition process phase, pedestal 108 may be lowered during another substrate transfer phase to allow removal of substrate 112 from pedestal 108.

While the example microvolume variations described herein refer to a height-adjustable pedestal, it will be appreciated that, in some embodiments, a position of showerhead 806 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some embodiments, pedestal 108 may include a rotational axis for rotating an orientation of substrate 112. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 1, showerhead 106 and pedestal 108 electrically communicate with RF power supply 114 and matching network 116 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Examples of suitable powers are included above. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 108 may be temperature controlled via heater 110. Further, in some embodiments, pressure control for processing apparatus 100 may be provided by one or more valve-operated vacuum sources such as butterfly valve 118. As shown in the embodiment of FIG. 1, butterfly valve 118 throttles a vacuum provided by a downstream vacuum pump (not shown). However, in some embodiments, pressure control of processing apparatus 100 may also be adjusted by varying a flow rate of one or more gases introduced to processing chamber 102. In some embodiments, the one or more valve-operated vacuum sources—such as butterfly valve 118—may be used for removing film precursor from the volumes surrounding the process stations during the appropriate ALD operational operations.

As described above, one or more process stations may be included in a multi-station substrate processing tool. FIG. 2 schematically illustrates an example of a system that includes a multi-station processing tool 200 which includes a plurality of process stations 201, 202, 203, 204 in a common low-pressure processing chamber 214. By maintaining each station in a low-pressure environment, defects caused by vacuum breaks between film deposition processes may be avoided.

As shown in FIG. 2, the system 200 has a substrate loading port 220, and a substrate handler robot 226 configured to move substrates from a cassette loaded from a pod 228, through atmospheric port 220, into the processing chamber 214, and finally onto a process station. Specifically, in this case, the substrate handler robot 226 loads substrates at process stations 201 and 202, and a substrate transferring device, in this case substrate carousel 290, transfers substrates between the various process stations 201, 202, 203, and 204. In the embodiment shown in FIG. 2, the substrate loading device is depicted as substrate handler robot 226 having 2 arms for substrate manipulation, and so, as depicted, it could load substrates at both stations 201 and 202 (perhaps simultaneously, or perhaps sequentially). Then, after loading at stations 201 and 202, the substrate transferring device, carousel 290 depicted in FIG. 2, can do a 180 degree rotation (about its central axis, which is substantially perpendicular to the plane of the substrates (coming out of the page), and substantially equidistant between the substrates) to transfer the two substrates from stations 201 and 202 to stations 203 and 204. At this point, handler robot 226 can load 2 new substrates at stations 201 and 202, completing the loading process. To unload, these steps can be reversed, except that if multiple sets of 4 wafers are to be processed, each unloading of 2 substrates by handler robot 226 would be accompanied by the loading of 2 new substrates prior to rotating the transferring carousel 290 by 180 degrees. Analogously, a one-armed handler robot configured to place substrates at just 1 station, say 201, would be used in a 4 step load process accompanied by 4 rotations of carousel 290 by 90 degrees to load substrates at all 4 stations.

The depicted processing chamber 214 shown in FIG. 2 provides four process stations, 201, 202, 203, and 204. Each station has a heated pedestal (shown at 218 for process station 901) and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 214 may include one or more matched pairs of ALD/CVD process stations. While the depicted processing chamber 214 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

As indicated above, FIG. 2 depicts an embodiment of a substrate transferring device 290 for transferring substrates between process stations 201, 202, 203, and 204 within processing chamber 214. It will be appreciated that any suitable substrate transferring device may be employed. Non-limiting examples include wafer carousels and substrate handler robots.

System Controllers

FIG. 2 also depicts an embodiment of a system that includes a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some embodiments, system controller 250 controls some or all of the operations of process tool 200 including the operations of its individual process stations. System controller 250 may execute machine-readable system control instructions 258 on processor 252—the system control instructions 258, in some embodiments, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components necessary to carry out various process tool processes. System control instructions 258 may be coded in any suitable computer readable programming language. In some embodiments, system control instructions 258 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 258 may include input/output control (IOC) sequencing instructions for controlling the various parameters described above. For example, each phase of a deposition process or processes may include one or more instructions for execution by system controller 250. The instructions for setting process conditions for a film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 254 and/or memory device 256 associated with system controller 250 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 218 and to control the spacing between the substrate and other parts of process tool 200. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes, e.g., curtain gas. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

System controller 250 may provide machine-readable instructions for implementing the herein-described deposition processes. The instructions may control a variety of process parameters, such as DC power level, RF bias power level, pressure, temperature, etc. The instructions may control the parameters to operate in-situ deposition of film stacks according to various embodiments described herein.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Improving Nonuniformity of a Substrate Using Curtain Gas in Substrate Processing Systems The systems discussed herein may be used to implement the techniques for controlling nonuniformity of a substrate using curtain gas as described above. In some such embodiments, a system for performing film deposition in a multi-station semiconductor processing tool may include one or more aspects of the systems described herein, such as a gas delivery system 101 of FIG. 1. The system may also include a processing chamber that includes at least two stations, such as the chamber 102 of FIG. 1 or the processing chamber 214 of FIG. 2. The processing chamber may share the gas delivery system and may be configured to flow a curtain gas around the periphery of each station. An example of such configuration is described herein, as well as in the aforementioned and incorporated patent applications titled "COMPOSITION-MATCHED CURTAIN GAS MIXTURES FOR EDGE UNIFORMITY MODULATION IN LARGE-VOLUME ALD REACTORS" and "METHODS AND APPARATUSES FOR SHOWERHEAD BACKSIDE PARASITIC PLASMA SUPPRESSION IN A SECONDARY PURGE ENABLED ALD SYSTEM."

The system may also include a controller, like the system controller described herein, e.g., system controller 250 of FIG. 2, for controlling the system to deposit a material on at least two substrates processed in separate stations. The controller may include control logic for implementing some or all aspects of the techniques discussed above, including all such aspects described above with respect to FIG. 11. In one embodiment, the controller may include control logic for flowing the curtain gas during film deposition to each station in the chamber according to process conditions, including a flow condition of a curtain gas that flows around the periphery of each station in the chamber, for performing film deposition in the chamber. Such flowing of the curtain gas may be the same as block 1152 of FIG. 11 described herein above and such description is incorporated herein.

The controller may also include control logic for determining an adjusted flow condition of the curtain gas in the chamber to improve substrate nonuniformity. The adjusted flow condition of the curtain gas may be done similarly to the adjusted flow conditions described herein above with respect to block 1154 of FIG. 11 and such discussion applies to this system and is incorporated herein. For instance, the adjusted flow condition of the curtain gas may be an adjusted flowrate of the curtain gas which may occur after the flowing of the curtain gas during film deposition according to process conditions, described directly above.

The controller may further include control logic for flowing the curtain gas during film deposition according to the adjusted flow condition. Again, this flowing may be the same as block 1156 and such discussion is incorporated herein. Furthermore, like described above, one or more of these three aspects may be performed in an experimental setting while one or more of the other aspects may be performed during substrate manufacturing. For example, the flowing of the curtain gas during film deposition according to the process conditions and determining an adjusted flow condition of the curtain gas (e.g., like blocks 1152 and 1154 of FIG. 11, respectively) may occur in an experimental setting while the flowing of the curtain gas according to the adjusted flow condition may be performed during substrate manufacturing.

In some embodiments, as discussed herein, the controller of the system may further include control logic for performing phases of a cyclical deposition process, for instance ALD, such as exposing substrates in each station to a precursor of material (e.g., dosing), removing at least some of the precursor from the chamber (e.g., purging), activating a reaction of the precursor on each substrate (e.g., activating), and removing, after the reaction, at least some of the gases in the chamber (e.g., purging). The flowing of the curtain gas during film deposition according to the adjusting may be performed during one or more of these phases, similar to the discussion above.

In some embodiments, the controller of the system may also include control logic for determining process conditions, including the flow of the curtain gas, for performing film deposition in the chamber. Such determining may be like that of block 1150 of FIG. 11 and such discussion is incorporated herein.

Detailed Description of Atomic Layer Deposition Techniques and Deposited Films

As discussed above, as devices sizes continue to shrink and ICs move to employing 3-D transistors and other 3-D structures, the ability to deposit a precise amount (thickness) of conformal film material—dielectrics in particular, but also various dopant-containing materials—has become increasingly important. Atomic layer deposition is one technique for accomplishing conformal film deposition that typically involves multiple cycles of deposition in order to achieve a desired thickness of film.

In contrast with chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films having a variety of chemistries—and also many variations on the basic ALD process sequence—are described in detail in U.S. patent application Ser. No. 13/084,399, filed Apr. 11, 2011, titled "PLASMA ACTIVATED CONFORMAL FILM DEPOSITION", U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411, U.S. patent application Ser. No. 13/224,240, filed Sep. 1, 2011, titled "PLASMA ACTIVATED CONFORMAL DIELECTRIC FILM DEPOSITION", and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION", each of which is incorporated by reference herein in its entirety for all purposes. As described in these prior applications, a basic ALD cycle for depositing a single layer of material on a substrate may include: (i) adsorbing a film precursor onto a substrate at a process station such that it forms an adsorption-limited layer, (ii) removing, when present, unadsorbed precursor ("unadsorbed precursor" defined to include desorbed precursor) from the vicinity of the process station, (iii) reacting the adsorbed-precursor to form a layer of film on the substrate, and optionally (iv) removing desorbed film precursor and/or reaction by-product from the vicinity of the process station. The removing in operations (ii) and (iv) may be done via purging, evacuating, pumping down to a base pressure ("pump-to-base"), etc. the volume surrounding the substrate. In some embodiments, the purge gas may be the same as the main plasma feed gas. The foregoing sequence of operations (i) through (iv) represent a single ALD cycle resulting in the formation of a single layer of film. However, since an single layer of film formed via ALD is typically very thing often it is only a single molecule thick—multiple ALD cycles are repeated in sequence to build up a film of appreciable thickness. Thus, if it is desired that a film of say N layers be deposited (or, equivalently, one might say N layers of film), then multiple ALD cycles (operations (i) through (iv)) may be repeated in sequence N times.

It is noted that this basic ALD sequence of operations (i) through (iv) doesn't necessary involve two chemiadsorbed reactive species P1 and P2 as in the example described above, nor does it even necessarily involve a second reactive species, although these possibilities/options may be employed, depending on the desired deposition chemistries involved.

Due to the adsorption-limited nature of ALD, however, a single cycle of ALD only deposits a thin film of material, and oftentimes only a single monolayer of material. For example, depending on the exposure time of the film precursor dosing operations and the sticking coefficients of the film precursors (to the substrate surface), each ALD cycle may deposit a film layer only about 0.5 to 3 Angstroms thick. Thus, the sequence of operations in a typical ALD cycle—operations (i) through (iv) just described—are generally repeated multiple times in order to form a conformal film of the desired thickness. Thus, in some embodiments, operations (i) through (iv) are repeated consecutively at least 1 time, or at least 2 times, or at least 3 times, or at least 5 times, or at least 7 times, or at least 10 times in a row. An ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma. The plasma may provide energy to drive the film-forming reaction on the substrate surface. In certain such embodiments, the plasma may be an oxidative plasma generated in the reaction chamber with application of suitable RF power (although in some embodiments, it may be generated remotely). In other embodiments, instead of an oxidative plasma, an inert plasma may be used. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Further variations on ALD processes are described in detail in the prior patent applications just cited (and which are incorporated by reference).

In some embodiments, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition—including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION"; U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes are oftentimes used to deposit conformal silicon oxide films (SiOx), however ALD processes may also be used to deposit conformal dielectric films of other chemistries as also disclosed in the foregoing incorporated specifications. ALD-formed dielectric films may, in some embodiments, contain a silicon carbide (SiC) material, a silicon nitride (SiN) material, a silicon carbonitride (SiCN) material, or a combination thereof. Silicon-carbon-oxides and silicon-carbon-oxynitrides, and silicon-carbon-nitrides may also be formed in some embodiment ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS,"; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Other examples of film deposition via ALD include chemistries for depositing dopant-containing films as described in the patent applications listed and incorporated by reference above (U.S. patent application Ser. Nos. 13/084,399, 13/242,084, 13/224,240, and 14/194,549). As described therein, various dopant-containing film precursors may be used for forming the dopant-containing films, such as films of boron-doped silicate glass (BSG), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like. Thus, dopant-containing films having dopants other than boron are feasible. Examples include gallium, phosphorous, or arsenic dopants, or other elements appropriate for doping a semiconductor substrate, such as other valence III and V elements.

As for ALD process conditions, ALD processes may be performed at various temperatures. In some embodiments, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes may be performed at various ALD reaction chamber pressures. In some embodiments, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some embodiments, suitable RF power may range from between about 100 W and 10 kW, or between about 200 W and 6 kW, or between about 500 W, and 3 kW, or between about 1 kW and 2 kW.

Various film precursor flow rates may be employed in operation (i). In some embodiments, suitable flow rates may range from about or between 0.1 mL/min to 10 mL/min, or about or between 0.5 mL/min and 5 mL/min, or about or between 1 mL/min and 3 mL/min.

Various gas flow rates may be used in the various operations. In some embodiments, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Also, once again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Detailed Description of Chandelier Showerheads and Showerhead Collars

Figure 6:
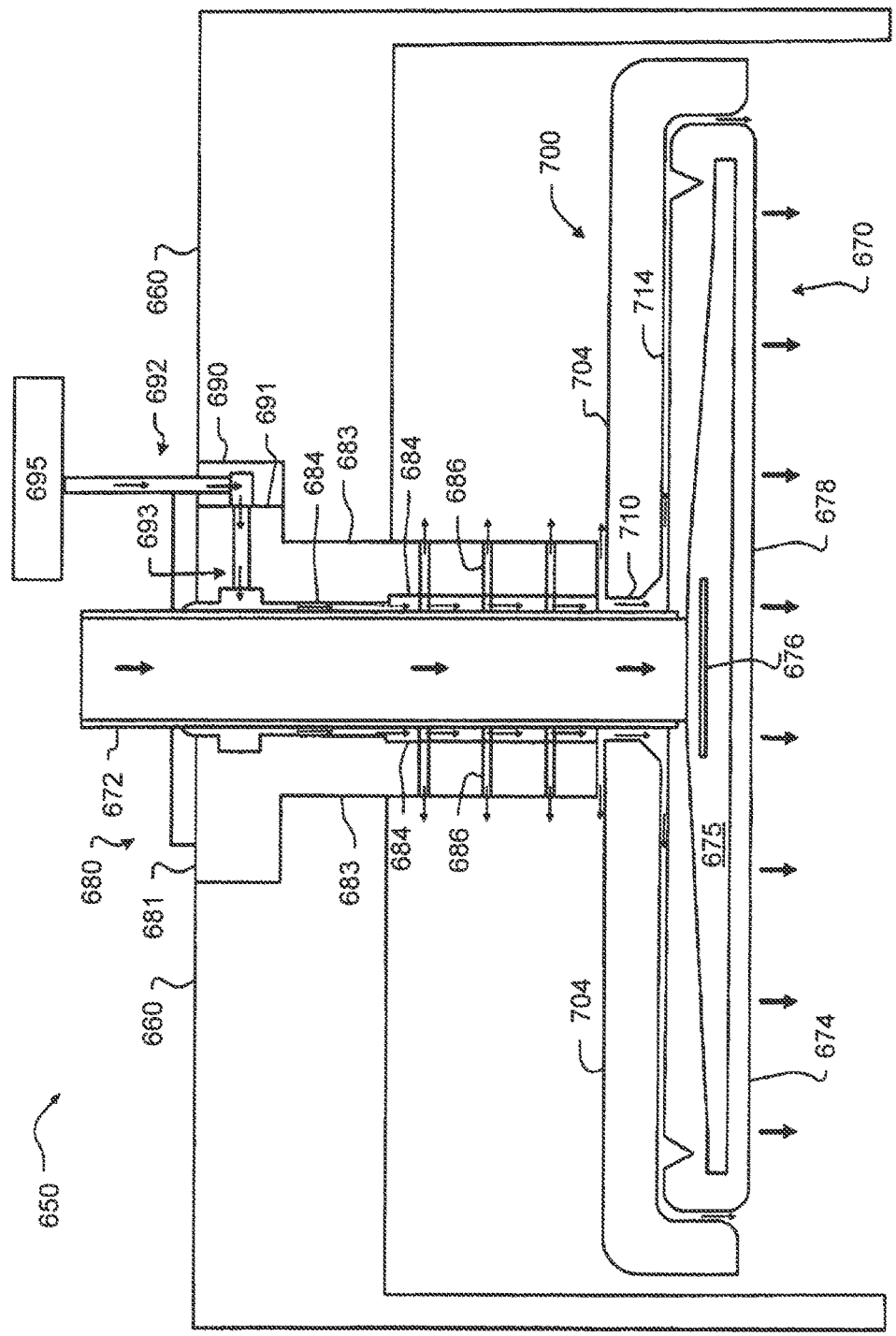
FIG. 6 depicts a more detailed cross-sectional view of a showerhead and showerhead collar in a substrate processing chamber also illustrating primary and secondary purge flowpaths.

In ALD processes, the film precursor generally needs to be alternatively present in the reaction chamber and then evacuated. To prevent parasitic deposition, the excess precursor in the processing chamber is removed from the processing chamber and the shared precursor pathways (such as within the stem of the showerhead) before introducing the next precursor. The removal of excess precursor is usually done by purging the delivery pathway and chamber with inert gas. When using a chandelier-type showerhead, however, the purge gas (which may be the same as the plasma feed gas) flowed to the chamber from the bottom surface of the head of the showerhead may not able to effectively remove the excess precursor present at the back of and/or behind the showerhead, around the stem, for example. Therefore, an appreciable amount of parasitic deposition may occur behind the showerhead, on the top plate, and/or on the processing chamber wall. It is not generally feasible and/or desirable to fill the dead space at the back of and/or behind the showerhead with solid dielectric since this often/likely causes RF coupling to ground. Hence, as described above, the curtain gas—whose primary purpose is to be flowed between process stations and thereby provide a degree of volumetric separation between them—may be introduced to the processing chamber behind the showerhead so that in addition to providing said volumetric separation, the flow of curtain gas may also work to prevent parasitic deposition behind the showerhead. Hardware for implementing such a release of curtain gas will now be described in detail:

Referring now to FIG. 6, an example of a substrate processing system 650 including a processing chamber 660 having a showerhead 670 is shown. The showerhead 670 includes a stem portion 672 and a head portion 674. The head portion 674 defines an inner cavity 675. Fluids such as precursor or plasma feed gas or purge gas (the latter two may be one and the same) flow through the stem portion 672, onto a dispersion plate 676 and into the inner cavity 675. The fluids then pass through apertures/spaced holes 678 in a bottom surface of the head portion 674 of the showerhead and into the processing chamber.

The stem portion 672 of the showerhead 670 is connected to a top wall of the processing chamber 660 by a showerhead collar 680. The showerhead collar 680 has a generally "T"-shaped cross section and includes a head portion 681 and a stem portion 683. The showerhead collar 680 defines an inner cavity 684 that is cylinder-shaped and that receives the stem portion 672 of the showerhead 670. A plurality of slot-shaped apertures 686 are formed in the stem portion 683 to allow a flow of curtain gas from the inner cavity 684 to an outer surface of the stem portion 683 of the showerhead collar. As is evident from the orientation of the slot-shaped apertures in FIG. 6 as well as the flow lines 320 shown in FIGS. 3 and 4, the curtain gas may be flowed through the apertures in the showerhead collar and into the processing chamber in a direction substantially parallel to the plane of the substrate and also substantially parallel to the plane of the bottom surface of the head portion of the showerhead.

A fluid connector 690 may be connected to an edge of the head portion 691 of the showerhead collar 680 and is used to supply fluid such as curtain gas. The fluid connector 690 includes one or more conduits and/or connectors that are generally identified at 692. The head portion 681 of the showerhead collar 680 likewise includes conduits and/or connectors that are generally identified at 693 to direct the flow of fluid (such as curtain gas) to the inner cavity 684 of the showerhead collar 680.

A curtain gas may be supplied to the showerhead collar 680, e.g., to fluid connector 690, by a curtain gas source 695.

A plate 700 is arranged between the head portion 674 of the showerhead 670 and the showerhead collar 680. The plate 700 includes an upper surface 704, a centering opening or bore 710, and a bottom surface 714. In some examples, the plate 700 is made of ceramic. A thickness of the plate 700 may be selected to minimize material and capacitive coupling to ground or parasitic plasma. The upper surface 704 of the plate 700 is spaced from a bottom edge of the showerhead collar 680 to allow fluid to pass there between. The centering bore 710 is also spaced from the stem portion 672 to allow fluid to pass there between. The bottom surface 714 of the plate is spaced from the upper surface of the showerhead 670 to allow fluid to flow there between. In some examples, the plate 700 may be omitted and the processing chamber may be operated without the plate 700.

Flowing curtain gas into the processing chamber through apertures in the stem portions of the showerhead collars associated with the showerheads of the various process stations substantially reduces and/or inhibits unwanted spurious deposition in remote areas of the processing chamber (such as at the backside of the showerheads). Dimensions of the slots and other gaps may be selected to prevent plasma light-up therein and to allow for a Peclet condition to be satisfied to prevent back diffusion for the desired gas flow rates.

Figure 7:
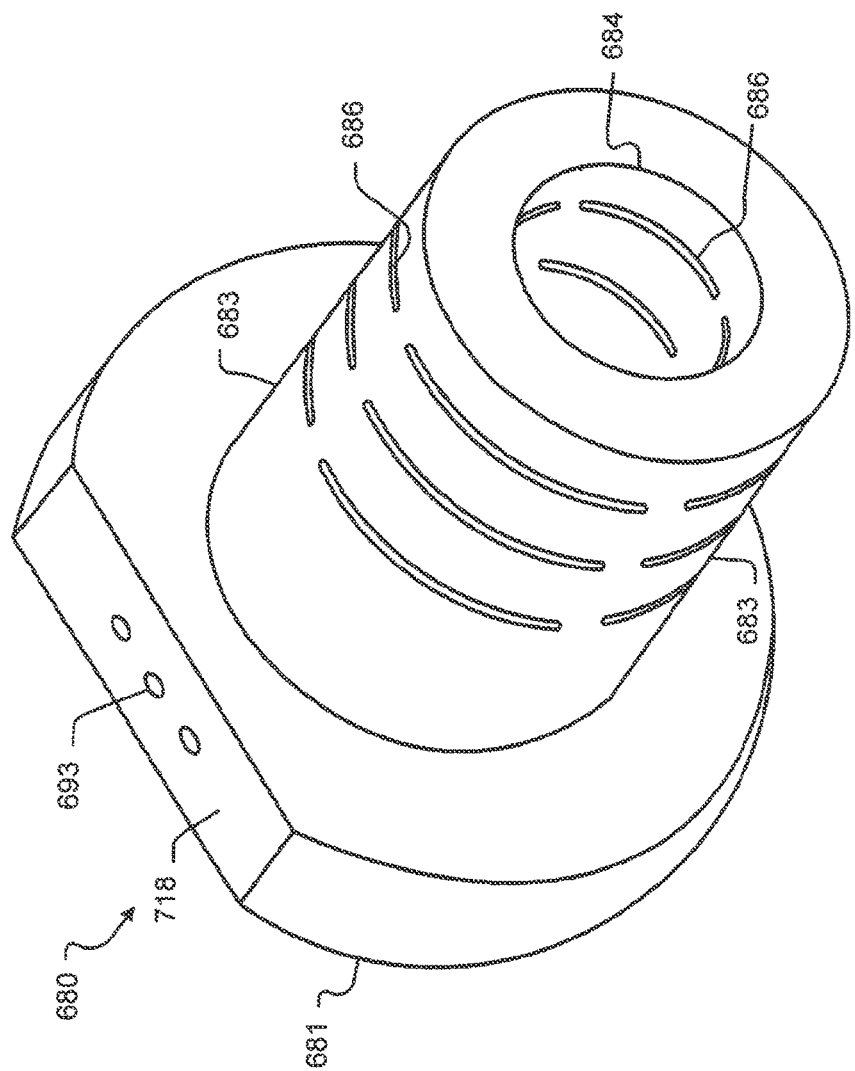
FIG. 7 depicts a perspective view of an example of a showerhead collar.

Referring now to FIG. 7, an example of the showerhead collar 680 is shown. The showerhead collar 680 includes the head portion 681 and the stem portion 683. The slots 686 may have an arcuate shape and may be arranged around the stem portion 683. The slots 686 allow fluid to flow through them from the inner cavity 684. The head portion 681 may include a mating portion 718 that mates with a corresponding mating portion on the fluid connector 690. When connected, the conduit 693 of the showerhead collar 680 is aligned with the conduit 692 of the fluid connector 690.

Referring now to FIG. 8, an example of the fluid connector 690 for the showerhead collar 680 is shown. While the fluid connector 690 is shown to include a second mating portion 720, a conduit 730, a connector 732, a conduit 734, and a connector 736, other configurations of the fluid connector are contemplated.

Referring now to FIGS. 9A and 9B, examples of the plate 700 are shown. In FIG. 9A, the upper surface 704 of the plate 700 is shown to have a generally circular cross-section and a centering bore 710 arranged at a center of the plate 700. The centering bore 710 includes one or more projections 740 that extend radially inwardly from the centering bore 710. The projections 740 provide uniform spacing between the plate 700 and the stem portion 672. In FIG. 9B, the bottom surface 714 of the plate 700 is shown to include projections 744 that extend downwardly relative to a top of the processing chamber. The projections 744 provide uniform spacing between the bottom surface 714 of the plate 700 and the upper surface of the head portion 674 of the showerhead 670. It is also noted that RF isolation/suppression devices may reduce electric fields in the cavity behind the showerhead, which may also help to further reduce the chance or extent of parasitic plasma generation in the region behind the showerhead. For instance, the projections 740 and 744 may provide spacing that is sufficiently close to reduce parasitic plasma generation—for example if a spacing of approximately 3 mm or less is employed. Such a spacing, for typical process conditions, results in an insufficient space for plasma to form along with plasma sheaths (less than two plasma sheath lengths). Formation of plasma may be affected by plasma density, plasma electron temperature, and voltage across the sheath. Of course, as discussed in detail above, use of a mixture of Ar and $O_2$ as the curtain gas emitted from the showerhead collars is an effective technique for preventing/minimizing parasitic plasma generation (as well as improving deposited film uniformity).

What is claimed is:

1. A method of depositing a film in a multi-station semiconductor processing chamber, the method comprising:
   (a) determining process conditions, including a flow condition of a curtain gas that flows around the periphery of each station in the processing chamber, for performing film deposition in the processing chamber;
   (b) flowing the curtain gas to each station in the processing chamber during a first set of one or more deposition cycles of a cyclic deposition process according to the process conditions determined in (a);
   (c) adjusting the flow condition of the curtain gas to an adjusted flow condition that improves substrate nonuniformity; and
   (d) flowing, after (c), the curtain gas during a second set of one or more deposition cycles of the cyclic deposition process according to the adjusted flow condition of (c) thereby improving substrate nonuniformity, wherein the adjusted flow condition of the curtain gas comprises an adjusted composition of the curtain gas.

2. The method of claim 1, wherein the flow condition of the curtain gas is a flowrate of the curtain gas and a composition of the curtain gas, and wherein the adjusted flow condition of the curtain gas is an adjusted flowrate of the curtain gas and an adjusted composition of the curtain gas.

3. The method of claim 2, wherein adjusting the flow condition of the curtain gas to the adjusted flow condition comprises adding one or more components to the curtain gas or subtracting one or more components from the curtain gas.

4. The method of claim 1, wherein the cyclic deposition process is an atomic layer deposition process.

5. The method of claim 1, wherein (b) is occurs before (d).

6. The method of claim 1, wherein (b) occurs after (d).

7. The method of claim 1, wherein the curtain gas comprises molecular oxygen.

8. The method of claim 7, wherein the adjusted composition of the curtain gas comprises an adjusted oxygen concentration in the curtain gas.

9. The method of claim 1, wherein:
   the multi-station semiconductor processing chamber includes a chandelier-type showerhead and a showerhead collar around a stem of the chandelier-type showerhead, and
   the curtain gas flows into the processing chamber through the showerhead collar.

10. The method of claim 1, wherein:
    the curtain gas comprises a mixture of oxygen and a second component selected from the group consisting of: argon and nitrogen, and
    the adjusted flow condition of the curtain gas comprises an adjusted composition of the curtain gas.

11. The method of claim 1, wherein:
    the curtain gas in (b) is a single-component gas, and
    the adjusted composition of the curtain gas comprises the single-component gas.

12. The method of claim 11, wherein:
    the single-component gas is oxygen, and
    the adjusted composition of the curtain gas further comprises one or more of: argon and nitrogen.

13. The method of claim 11, wherein the single-component gas is selected from the group consisting of: oxygen, argon, and nitrogen.

14. The method of claim 1, wherein:
the curtain gas in (a) is a gas mixture that comprises a single-component gas, and
the curtain gas in (d) is the single-component gas.

15. The method of claim 14, wherein the single-component gas is selected from the group consisting of: oxygen, argon, and nitrogen.

16. The method of claim 14, wherein:
the single-component gas is oxygen, and
the curtain gas in (a) comprises oxygen and one or more of: argon and nitrogen.

17. A system for performing film deposition in a multi-station semiconductor processing tool, the system comprising:
a gas delivery system;
a processing chamber that includes at least two stations, wherein:
each station shares the gas delivery system, and
the processing chamber is configured to flow a curtain gas around the periphery of each station; and
a controller for controlling the system to deposit a material on at least two substrates processed in separate stations, the controller comprising control logic for:
(a) flowing the curtain gas to each station in the processing chamber during a first set of one or more deposition cycles of a cyclic deposition process according to process conditions, including a flow condition of a curtain gas that flows around the periphery of each station in the processing chamber, for performing film deposition in the processing chamber;
(b) adjusting the flow condition of the curtain gas to an adjusted flow condition that improves substrate non-uniformity, wherein the adjusted flow condition of the curtain gas comprises an adjusted composition of the curtain gas; and
(c) flowing, after (b), the curtain gas during a second set of one or more deposition cycles of the cyclic deposition process according to the adjusted flow condition of (b) thereby improving substrate nonuniformity.

18. The system of claim 17, wherein the flow condition of the curtain gas is a flowrate of the curtain gas and a composition of the curtain gas, and wherein the adjusted flow condition of the curtain gas is an adjusted flowrate of the curtain gas and an adjusted composition of the curtain gas.

19. The system of claim 18, wherein the control logic for adjusting the flow condition of the curtain gas to the adjusted flow condition comprises control logic for adding one or more components to the curtain gas or subtracting one or more components from the curtain gas.

20. The system of claim 17, wherein the controller further comprises control logic for repeating (a), (b), and (c) during the cyclic deposition process.

21. The system of claim 17, wherein the cyclic deposition process is an atomic layer deposition process.

22. The system of claim 17, wherein the controller further comprises control logic for:
performing (a) before (c), and
performing (a) after (c).

23. The system of claim 17, wherein the curtain gas comprises molecular oxygen.

24. The system of claim 17, wherein the adjusted composition of the curtain gas comprises an adjusted oxygen concentration in the curtain gas.

25. The system of claim 17, further comprising:
a chandelier-type showerhead for flowing gas into the processing chamber, and
a showerhead collar around a stem of the chandelier-type showerhead, wherein the curtain gas flows into the processing chamber through the showerhead collar.

26. The system of claim 17, wherein the controller further comprises control logic for:
(d) adjusting a second flow condition of the curtain gas to a second adjusted flow condition that improves substrate nonuniformity; and
(e) flowing, after (d), the curtain gas during a third set of one or more deposition cycles of the cyclic deposition process according to the second adjusted flow condition of (d) thereby improving substrate nonuniformity.

27. The system of claim 17, wherein:
the curtain gas in (a) is a single-component gas, and
the adjusted composition of the curtain gas comprises the single-component gas.

28. The system of claim 27, wherein:
the single-component gas is oxygen, and
the adjusted composition of the curtain gas further comprises one or more of: argon and nitrogen.

29. The system of claim 27, wherein the single-component gas is selected from the group consisting of: oxygen, argon, and nitrogen.

30. The system of claim 17, wherein:
the curtain gas in (a) is a gas mixture that comprises a single-component gas, and
the curtain gas in (c) is the single-component gas.

31. The system of claim 30, wherein the single-component gas is selected from the group consisting of: oxygen, argon, and nitrogen.

32. The method of claim 30, wherein:
the single-component gas is oxygen, and
the curtain gas in (a) comprises oxygen and one or more of: argon and nitrogen.

* * * * *